US012672276B2

(12) United States Patent
Kim

(10) Patent No.: US 12,672,276 B2
(45) Date of Patent: Jun. 30, 2026

(54) SEMICONDUCTOR DEVICE AND METHOD FOR FABRICATING THE SAME

(71) Applicant: SK hynix Inc., Gyeonggi-do (KR)

(72) Inventor: Song Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 385 days.

(21) Appl. No.: 18/340,035

(22) Filed: Jun. 23, 2023

(65) Prior Publication Data

US 2024/0188283 A1 Jun. 6, 2024

(30) Foreign Application Priority Data

Dec. 1, 2022 (KR) ........................ 10-2022-0165690

(51) Int. Cl.
 H10B 12/00 (2023.01)
 H10D 1/68 (2025.01)
 H10D 30/67 (2025.01)
 H10D 62/10 (2025.01)
(52) U.S. Cl.
 CPC ......... H10B 12/482 (2023.02); H10B 12/488 (2023.02); H10D 1/692 (2025.01); H10D 30/6735 (2025.01); H10D 62/121 (2025.01)
(58) Field of Classification Search
 CPC .... H10B 12/482; H10B 12/488; H10B 12/00; H10B 12/033; H10B 12/30; H10B 12/03; H10B 12/50; H10B 12/05; H10B 12/02;

H10D 1/692; H10D 30/6735; H10D 62/121; H10D 1/716; H10D 30/031; H10D 30/6757; H10D 30/0243; H10D 64/017; H10D 30/014; H10D 30/43; B82Y 10/00
See application file for complete search history.

(56) References Cited

U.S. PATENT DOCUMENTS

| | | | | |
|---|---|---|---|---|
| 10,607,995 | B2 * | 3/2020 | Roberts ................. | H10B 12/05 |
| 2017/0025176 | A1 * | 1/2017 | Lee .................... | G11C 16/3459 |
| 2018/0323199 | A1 | 11/2018 | Roberts et al. | |
| 2020/0279601 | A1 * | 9/2020 | Kim .................... | G11C 11/4097 |
| 2021/0183862 | A1 | 6/2021 | Son et al. | |
| 2022/0223596 | A1 * | 7/2022 | Ayyapureddi ..... | H10D 30/6731 |

* cited by examiner

*Primary Examiner* — Jonathan Han
(74) *Attorney, Agent, or Firm* — IP & T GROUP LLP

(57) ABSTRACT

A semiconductor device includes a lower structure; a vertical conductive line extending in a first direction which is perpendicular to a surface of the lower structure; a reservoir capacitor disposed over the lower structure to be spaced apart from the vertical conductive line; a bridge horizontal layer disposed between the vertical conductive line and the reservoir capacitor and extending horizontally in a second direction which is parallel to the surface of the lower structure; and a pair of horizontal layers extending in a third direction intersecting the bridge horizontal layer with the bridge horizontal layer interposed therebetween.

14 Claims, 15 Drawing Sheets

MCA

RCA

PERI

C

C'

D1

D3

D2

SEMICONDUCTOR DEVICE AND METHOD FOR FABRICATING THE SAME

CROSS-REFERENCE TO RELATED APPLICATIONS

The present application claims priority of Korean Patent Application No. 10-2022-0165690, filed on Dec. 1, 2022, which is incorporated herein by reference in its entirety.

BACKGROUND

1. Field

Various embodiments of the present invention relate to a semiconductor device and, more particularly, to a three-dimensional semiconductor device, and a method for fabricating the three-dimensional semiconductor device.

2. Description of the Related Art

Recently, three-dimensional semiconductor devices including memory cells that are arranged in three dimensions have been proposed. Extensive research is currently undertaken for improving the structural and performance characteristics of such three dimensional semiconductor devices.

SUMMARY

Embodiments of the present invention are directed to a highly integrated semiconductor device, and a method for fabricating the same.

In accordance with an embodiment of the present invention, a semiconductor device includes: a lower structure; a vertical conductive line extending in a first direction which is perpendicular to a surface of the lower structure; a reservoir capacitor disposed over the lower structure to be spaced apart from the vertical conductive line; a bridge horizontal layer disposed between the vertical conductive line and the reservoir capacitor and extending horizontally in a second direction which is parallel to the surface of the lower structure; and a pair of horizontal layers extending in a third direction intersecting the bridge horizontal layer with the bridge horizontal layer interposed therebetween.

In accordance with another embodiment of the present invention, a semiconductor device includes: a memory cell array including a three-dimensional array of cell capacitors; and a reservoir capacitor array which is horizontally spaced apart from the memory cell array and includes a three-dimensional array of reservoir capacitor structures, wherein each of the reservoir capacitor structures includes: a vertical conductive line; a reservoir capacitor which is spaced apart from the vertical conductive line and has the same structure as structures of the cell capacitors; a bridge horizontal layer oriented horizontally between the vertical conductive line and the reservoir capacitor; and a pair of horizontal layers extending in a direction intersecting the bridge horizontal layer with the bridge horizontal layer interposed therebetween.

In accordance with another embodiment of the present invention, a method for fabricating a semiconductor device includes: forming a sub-stack which includes a first sacrificial layer, a second sacrificial layer, and a semiconductor layer between the first sacrificial layer and the second sacrificial layer over a lower structure; replacing the first and second sacrificial layers with first and second conductive horizontal layers; replacing the semiconductor layer with a conductive bridge horizontal layer; forming a vertical conductive line which is coupled to a first side of the conductive bridge horizontal layer to be oriented vertically; and forming a reservoir capacitor which is coupled to a second side of the conductive bridge horizontal layer. The replacing of the first and second sacrificial layers with the first and second conductive horizontal layers includes: horizontally recessing portions of the first and second sacrificial layers to form horizontal recesses that exposes portions of a surface of the semiconductor layer; forming a dielectric layer over the exposed surface of the semiconductor layer; and filling the horizontal recesses with a conductive material to form the first and second conductive horizontal layers. The replacing of the semiconductor layer with the conductive bridge horizontal layer includes removing the semiconductor layer to form a bridge gap between the first conductive horizontal layer and the second conductive horizontal layer; and filling the bridge gap with a metal-based material to form the conductive bridge horizontal layer. The first sacrificial layer and the second sacrificial layer are formed of silicon nitride, and the semiconductor layer is formed of a silicon layer.

In accordance with another embodiment of the present invention, a method for fabricating a semiconductor device includes: forming a memory cell array including a three-dimensional array of memory cells; and forming a reservoir capacitor array including a three-dimensional array of reservoir capacitor structures that are spaced horizontally from the memory cell array, wherein the forming of the reservoir capacitor array includes: forming a horizontal layer including a bridge horizontal layer and a double horizontal layer extending in a direction intersecting the bridge horizontal layer with the bridge horizontal layer interposed therebetween; forming a vertical conductive line coupled to a first-side of the bridge horizontal layer, and forming a reservoir capacitor coupled to a second side of the bridge horizontal layer.

In accordance with another embodiment of the present invention, a method for fabricating a three-dimensional reservoir capacitor includes: forming a stack body that includes a first sacrificial layer, a second sacrificial layer, and a semiconductor layer between the first sacrificial layer and the second sacrificial layer over the lower structure; replacing the first and second sacrificial layers with first and second conductive horizontal layers; replacing the semiconductor layer with a conductive bridge horizontal layer; forming a vertical conductive line that is coupled to a first side of the conductive bridge horizontal layer and oriented vertically; forming a first electrode that is coupled to a second side of the conductive bridge horizontal layer; forming a dielectric layer over the first electrode; and forming a second electrode over the dielectric layer.

In accordance with another embodiment of the present invention, a method for fabricating a three-dimensional capacitor array includes: forming a first capacitor array over a first region of a lower structure; and forming a second capacitor array over a second region of the lower structure, wherein the first capacitor array includes cell capacitors, and the second capacitor array includes a vertical conductive line, a conductive bridge horizontal layer that is oriented horizontally from the vertical conductive line, a pair of conductive horizontal layers respectively intersecting lower and upper portions of the bridge horizontal layer, and a reservoir capacitor that is coupled to the bridge horizontal layer.

In accordance with another embodiment of the present invention, a semiconductor device includes: a peripheral circuit portion; a three-dimensional array of memory cells disposed at a higher level than the peripheral circuit portion and including vertical bit lines, horizontal word lines, and cell capacitors; and a reservoir capacitor array that is disposed horizontally from the three-dimensional array of the memory cells at a higher level than the peripheral circuit portion and includes reservoir capacitors at the same horizontal level as the cell capacitors, wherein the reservoir capacitor array includes a vertical conductive line; a bridge horizontal layer that is oriented horizontally between the vertical conductive line and the reservoir capacitors; and a pair of horizontal layers extending in a direction intersecting the bridge horizontal layer with the bridge horizontal layer interposed therebetween.

These and other features and advantages of the present invention will become better understood from the following detailed description and drawings.

BRIEF DESCRIPTION OF THE DRAWINGS

FIG. 5 is a schematic perspective view illustrating a semiconductor device in accordance with another embodiment of the present invention.

DETAILED DESCRIPTION

Figure 1:
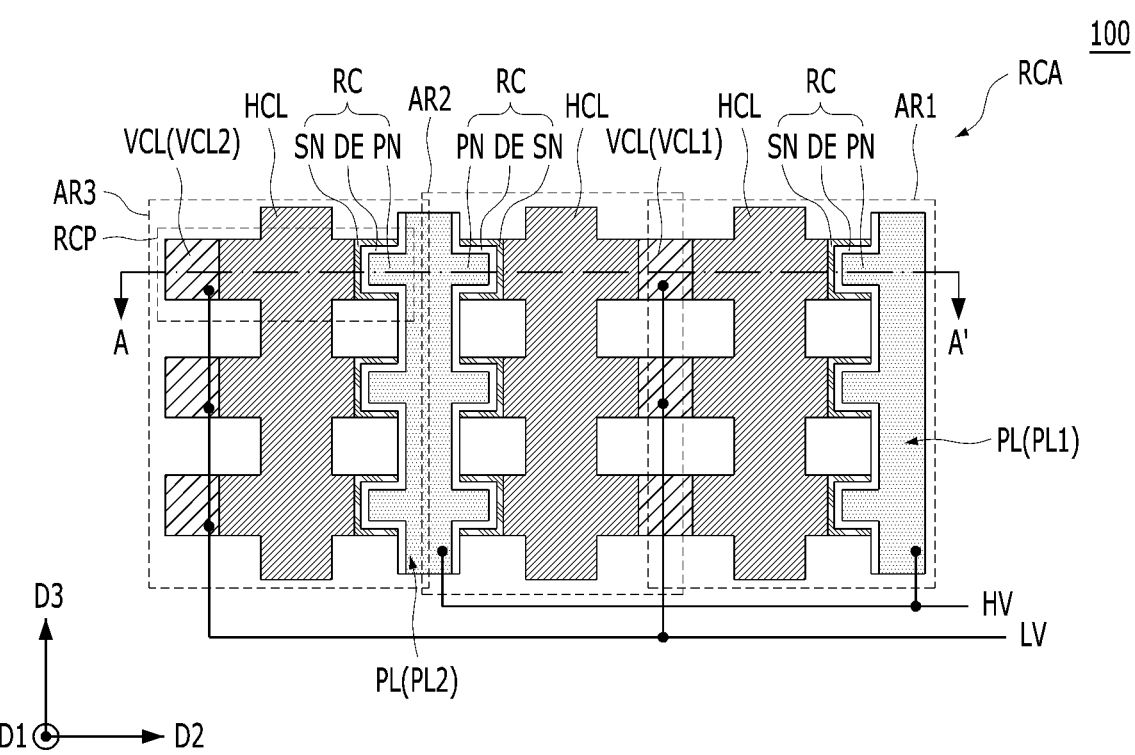
FIG. 1 is a schematic plan view illustrating a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

An embodiment of the present invention as described below may significantly increase the memory cell density and reduce or eliminate the parasitic capacitance of a three dimensional semiconductor device including vertically stacked memory cells in a novel configuration.

A semiconductor device such as a Dynamic Random Access Memory (DRAM) may include a capacitor for stable power supply and/or stabilization of transferred signals as well as a memory cell array. In particular, in order to stabilize the voltage from such factors as noise, a reservoir capacitor having a large capacitance may be formed in the spare space of a peripheral circuit.

Figure 2:
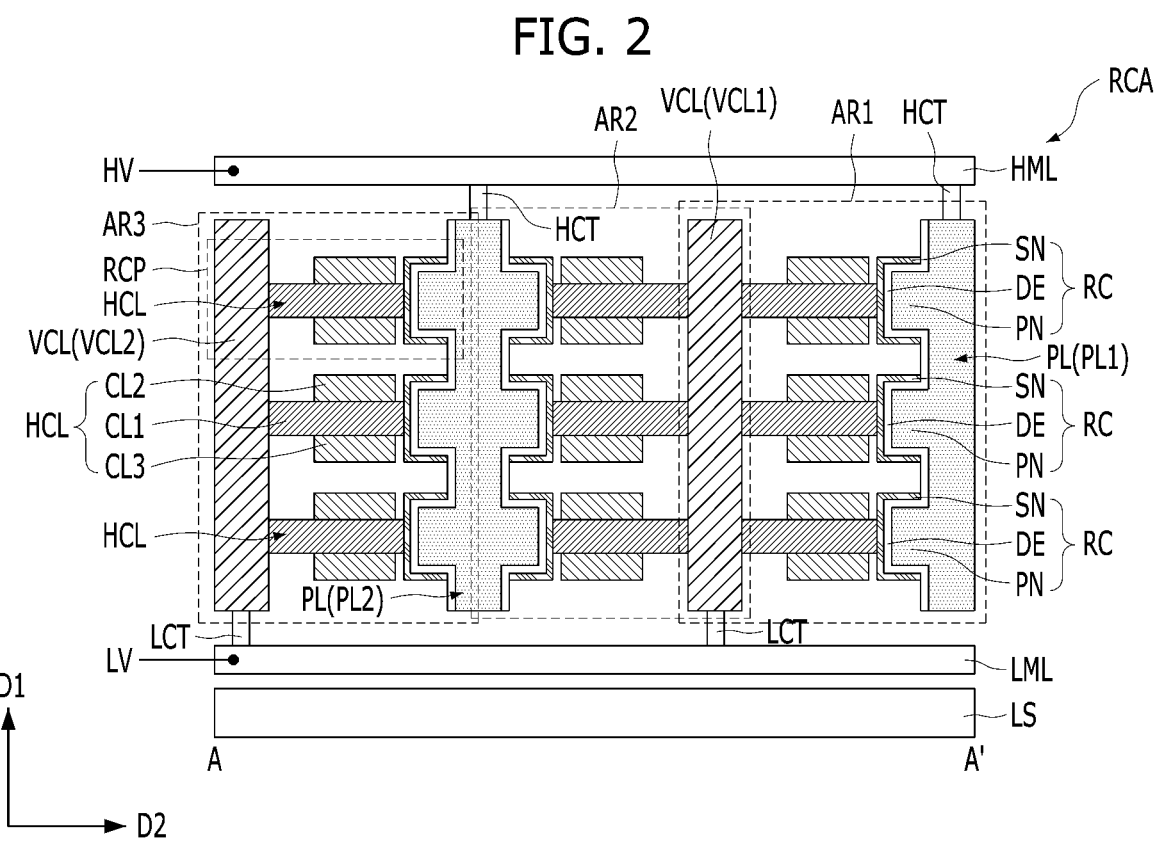
FIG. 2 is a cross-sectional view taken along a line A-A' shown in FIG. 1 in accordance with an embodiment of the present invention.
Figure 3:
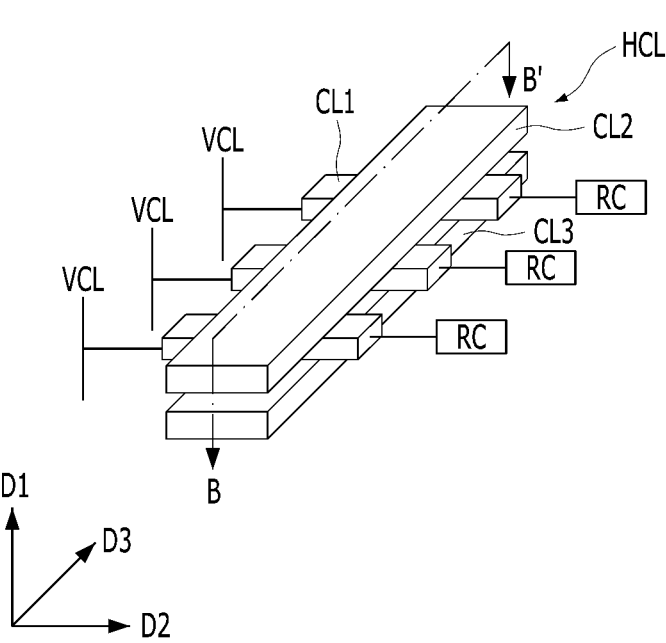
FIG. 3 is a schematic perspective view illustrating a horizontal conductive line HCL shown in FIG. 1 in accordance with an embodiment of the present invention.
Figure 4:
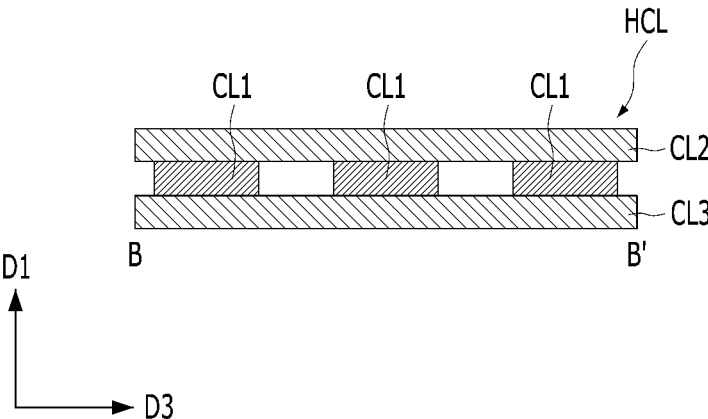
FIG. 4 is a plan view taken along a line B-B' shown in FIG. 3 in accordance with an embodiment of the present invention.

FIG. 1 is a schematic plan view illustrating a semiconductor device 100 in accordance with an embodiment of the present invention. FIG. 2 is a cross-sectional view taken along a line A-A' shown in FIG. 1 in accordance with an embodiment of the present invention. FIG. 3 is a schematic perspective view illustrating a horizontal conductive line HCL shown in FIG. 1 in accordance with an embodiment of the present invention. FIG. 4 is a plan view taken along a line B-B' shown in FIG. 3 in accordance with an embodiment of the present invention.

Referring to FIGS. 1 to 4, the semiconductor device 100 may include a lower structure LS and a reservoir capacitor array RCA. The reservoir capacitor array RCA may include a three-dimensional array of a plurality of reservoir capacitor structures RCP. For example, the reservoir capacitor array RCA may include a first array AR1, a second array AR2, and a third array AR3. Each of the first to third arrays AR1, AR2 and AR3 may include a plurality of the reservoir capacitor structures RCP that are stacked over the lower structure LS in a first direction D1. Each of the first to third arrays AR1, AR2 and AR3 may include a 3D array of the reservoir capacitor structures RCP.

Each of the reservoir capacitor structures RCP may include a vertical conductive line VCL, a horizontal conductive line HCL, a reservoir capacitor RC, and a common plate PL. The reservoir capacitor RC may include a first electrode SN, a second electrode PN, and a dielectric layer DE disposed between the first electrode SN and the second electrode PN.

Each of the first electrodes SN of the reservoir capacitors RC may be coupled to a corresponding horizontal conductive line HCL. The horizontal conductive lines HCL may be commonly coupled to the vertical conductive line VCL. The second electrodes PN of the reservoir capacitors RC may be commonly coupled to the common plate PL. The reservoir capacitors RC that are stacked in the first direction D1 may share a vertical conductive line VCL and a common plate PL.

In each of the first to third arrays AR1, AR2 and AR3, the reservoir capacitor structures RCP may be horizontally disposed in a third direction D3.

The reservoir capacitor array RCA may include a column array of the reservoir capacitor structures RCP, and a row array of the reservoir capacitor structures RCP. For example, the reservoir capacitor array RCA may include a column array of the reservoir capacitor structures RCP that are stacked in the first direction D1. Also, the reservoir capacitor array RCA may include a row array of the reservoir capacitor structures RCP that are horizontally disposed in the second and third directions D2 and D3. Each of the first to third arrays AR1, AR2 and AR3 may include a column array of the reservoir capacitor structures RCP that are stacked in the first direction D1 and a row array of the reservoir capacitor structures RCP that are disposed in the third direction D3.

The reservoir capacitor structures RCP of the first array AR1 may share a first common plate PL1. The reservoir capacitor structures RCP of the second array AR2 and the reservoir capacitor structures RCP of the third array AR3 may share a second common plate PL2.

The reservoir capacitor structures RCP of the first array AR1 and the reservoir capacitor structures RCP of the second array AR2 may share a first vertical conductive line VCL1. The reservoir capacitor structures RCP of the third array AR3 may share a second vertical conductive line VCL2.

The first array AR1 and the second array AR2 may be mirror-type arrays that share the first vertical conductive line VCL1. The second array AR2 and the third array AR3 may be mirror-type arrays that share the second common plate PL2.

The vertical conductive line VCL may be vertically oriented in the first direction D1. The vertical conductive line VCL may include a silicon-based material, a metal-based material, or a combination thereof. The vertical conductive line VCL may include silicon, a metal, a metal nitride, a metal silicide, or a combination thereof. The vertical conductive line VCL may include polysilicon, titanium nitride, tungsten, or a combination thereof. For example, the vertical conductive line VCL may include polysilicon or titanium nitride (TiN) that is doped with an N-type impurity. The vertical conductive line VCL may include a TiN/W stack that includes titanium nitride and tungsten over the titanium nitride.

The first electrode SN may have a three-dimensional structure, and the first electrode SN of the three-dimensional structure may have a horizontal three-dimensional structure which is oriented in a second direction D2. As an example of the three-dimensional structure, the first electrode SN may have a cylinder shape. According to another embodiment of the present invention, the first electrode SN may have a pillar shape or a pylinder shape. The pylinder shape may refer to a structure in which a pillar shape and a cylinder shape are merged.

The first electrode SN and the second electrode PN may include a metal, a noble metal, a metal nitride, a conductive metal oxide, a conductive noble metal oxide, a metal carbide, a metal silicide, or a combination thereof. For example, the first electrode SN and the second electrode PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, and/or a tungsten nitride/tungsten (WN/W) stack. The second electrode PN may include a combination of a metal-based material and a silicon-based material. For example, the second electrode PN may be a stack of titanium nitride/silicon germanium/tungsten nitride (TiN/SiGe/WN).

The dielectric layer DE may include silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. As the dielectric layer DE, the high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer including two or more layers of the aforementioned high-k materials.

The dielectric layer DE may be formed of zirconium (Zr)-based oxide. The dielectric layer DE may have a stack structure including at least zirconium oxide ($ZrO_2$). The dielectric layer DE may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer. According to another embodiment of the present invention, the dielectric layer DE may be formed of hafnium (Hf)-based oxide. The dielectric layer DE may have a stack structure including at least hafnium oxide ($HfO_2$). The dielectric layer DE may include a HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a greater bandgap energy (which will be, hereinafter, simply referred to as bandgap) than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material having a greater bandgap than the high-k material. The dielectric layer DE may include silicon oxide ($SiO_2$) as a high bandgap material other than aluminum oxide ($Al_2O_3$). Since the dielectric layer DE includes a high bandgap material, leakage current may be suppressed. The high-bandgap material may be thinner than the high-k material.

According to another embodiment of the present invention, the dielectric layer DE may include a laminated structure in which a high-k material and a high-bandgap material are alternately stacked. For example, the dielectric layer DE may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the above laminated structure, aluminum oxide ($Al_2O_3$) may be thinner than zirconium oxide ($ZrO_2$) and hafnium oxide ($HfO_2$).

According to another embodiment of the present invention, the dielectric layer DE may include a stack structure, a laminated structure, or a mixed structure including zirconium oxide, hafnium oxide, and aluminum oxide.

According to another embodiment of the present invention, the dielectric layer DE may include a ferroelectric material or an antiferroelectric material. The ferroelectric material may include HfZrO, HfSiO, or a combination thereof.

According to another embodiment of the present invention, an interface control layer for improving leakage current may be further formed between the first electrode SN and the dielectric layer DE. The interface control layer may include titanium oxide (TiO$_2$), niobium oxide, or niobium nitride. The interface control layer may also be formed between the second electrode PN and the dielectric layer DE.

The reservoir capacitor RC may include a metal-insulator-metal (MIM) capacitor.

Referring again to FIGS. 2 to 4, each horizontal conductive line HCL may include a bridge horizontal layer CL1, an upper-level horizontal layer CL2, and a lower-level horizontal layer CL3. The bridge horizontal layer CL1 may be coupled to the vertical conductive line VCL and the first electrode SN of the reservoir capacitor RC. For example, the bridge horizontal layer CL1 may include a first end edge contacting the vertical conductive line VCL, and a second end edge opposite to the first end edge contacting the first electrode SN of the reservoir capacitor RC. The upper-level horizontal layer CL2 and the lower-level horizontal layer CL3 may be coupled to the bridge horizontal layer CL1. The bridge horizontal layer CL1 may extend in the second direction D2, and the upper-level horizontal layer CL2 and the lower-level horizontal layer CL3 may extend in the third direction D3. The width of the bridge horizontal layer CL1 in the second direction D2 may be greater than the widths of the upper-level horizontal layer CL2 and the lower-level horizontal layer CL3. The height of the bridge horizontal layer CL1 in the first direction may be smaller than the heights of the upper-level horizontal layer CL2 and the lower-level horizontal layer CL3. A plurality of bridge horizontal layers CL1 disposed in the third direction D3 may be coupled to one upper-level horizontal layer CL2 and one lower-level horizontal layer CL3 in common.

The upper-level horizontal layer CL2 and the lower-level horizontal layer CL3 may face each other in the first direction D1 with the bridge horizontal layer CL1 interposed therebetween.

The horizontal conductive line HCL may include a metal, a metal compound, a semiconductor material, or a combination thereof. The bridge horizontal layer CL1, the upper-level horizontal layer CL2, and the lower-level horizontal layer CL3 may include a conductive material. The bridge horizontal layer CL1, the upper-level horizontal layer CL2, and the lower-level horizontal layer CL3 may include a metal, a metal alloy, a semiconductor material, or a combination thereof. For example, each of the bridge horizontal layer CL1, the upper-level horizontal layer CL2, and the lower-level horizontal layer CL3 may include titanium nitride, tungsten, molybdenum, molybdenum nitride, polysilicon, or a combination thereof. The bridge horizontal layer CL1, the upper-level horizontal layer CL2, and the lower-level horizontal layer CL3 may be formed of the same material. According to another embodiment of the present invention, the bridge horizontal layer CL1 may be formed of a first metal material, and the upper-level horizontal layer CL2 and the lower-level horizontal layer CL3 may be formed of a second metal material. The first metal material and the second metal material may include different metals. According to the embodiment of the present invention, the bridge horizontal layer CL1, the upper-level horizontal layer CL2, and the lower-level horizontal layer CL3 may include a TiN/W stack in which metal-based materials, for example, titanium nitride and tungsten are sequentially stacked. According to another embodiment of the present invention, the bridge horizontal layer CL1, the upper-level horizontal layer CL2, and the lower-level horizontal layer CL3 may include a high work function material, a low work function material, or a combination thereof. The low work function material may have a low work function of approximately 4.5 eV or less, and the high work function material may have a high work function of approximately 4.5 eV or more. For example, the low work function material may include N-type doped polysilicon, and the high work function material may include tungsten, titanium nitride, or a combination thereof. According to another embodiment of the present invention, the bridge horizontal layer CL1, the upper-level horizontal layer CL2, and the lower-level horizontal layer CL3 may have a dual work function structure in which a low work function material and a high work function material are combined.

Referring back to FIGS. 1 and 2, vertical conductive lines VCL of the reservoir capacitor structures RCP may be electrically connected to a first node LML. The common plates PL of the reservoir capacitor structures RCP may be electrically connected to a second node HML. A first contact node LCT may be formed between the first node LML and each of the vertical conductive lines VCL. A second contact node HCT may be formed between the second node HML and each of the common plates PL.

A low voltage LV may be applied to the first node LML, and a high voltage HV may be applied to the second node HML. The first node LML may be referred to as a low voltage node, and the second node HML may be referred to as a high voltage node.

Figure 5:
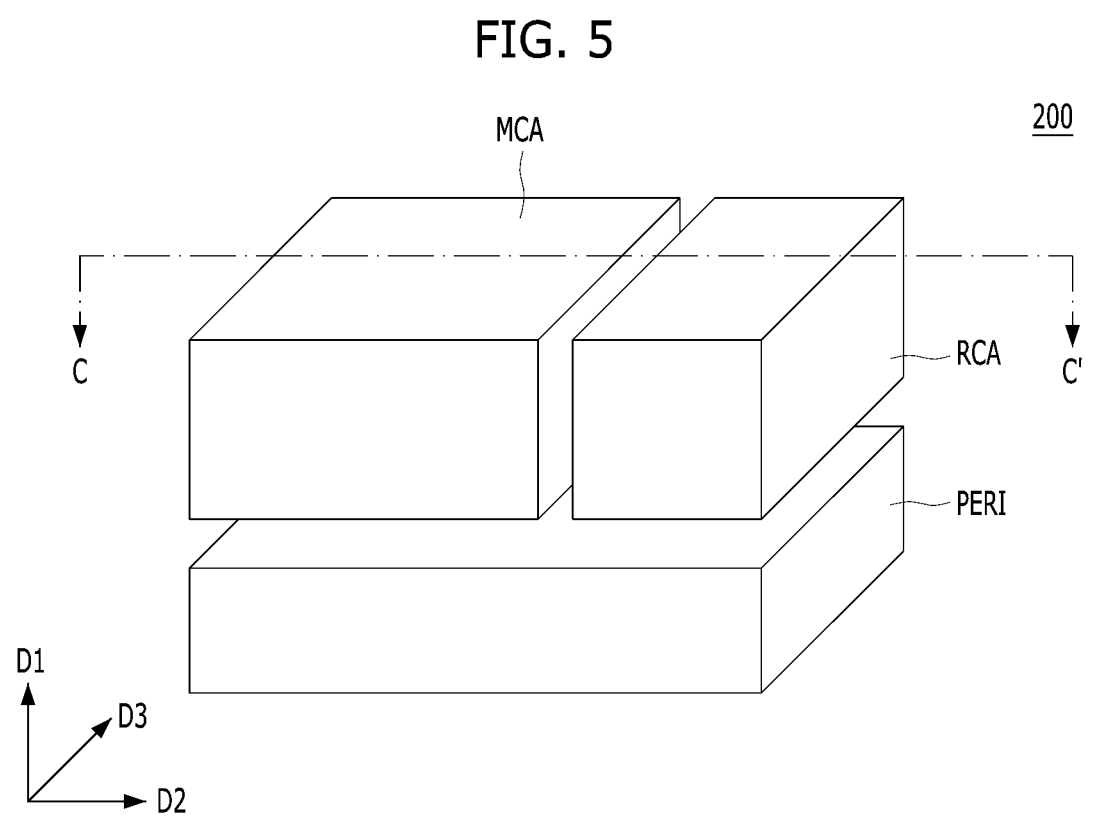
Figure 6:
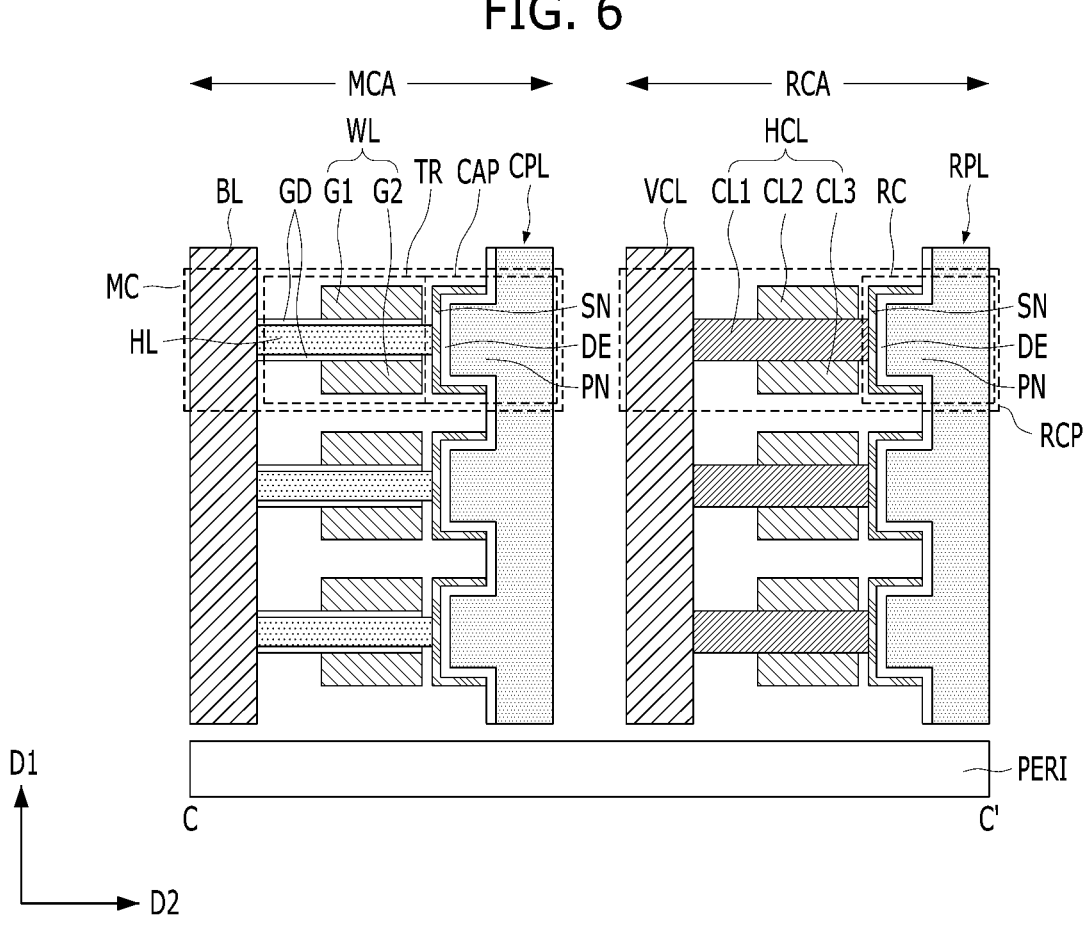
FIG. 6 is a schematic cross-sectional view taken along a line C-C' shown in FIG. 5 in accordance with an embodiment of the present invention.
Figure 7:
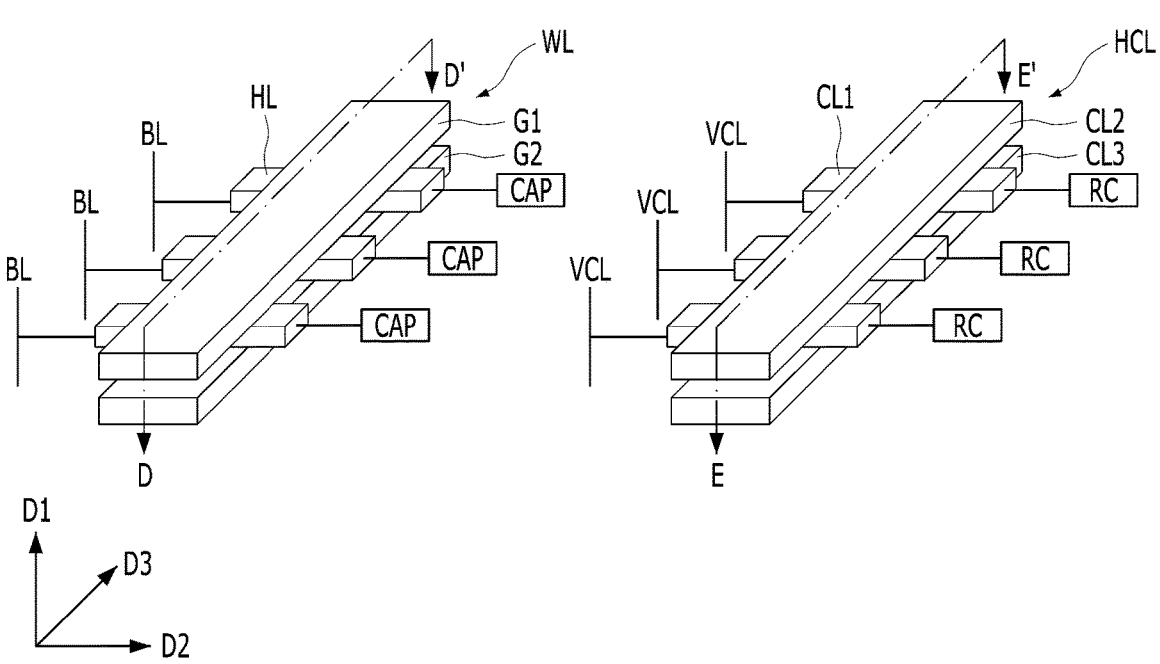
FIG. 7 is a schematic perspective view illustrating a word line and a horizontal conductive line in accordance with an embodiment of the present invention.
Figure 8:
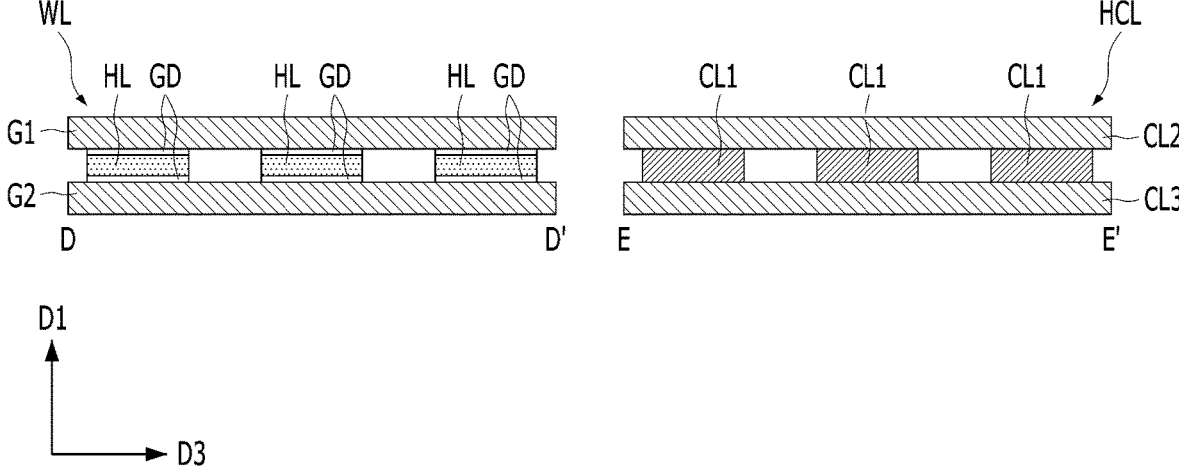
FIG. 8 is a schematic cross-sectional view taken along a line D-D' and a line E-E' shown in FIG. 7 in accordance with an embodiment of the present invention.

FIG. 5 is a schematic perspective view illustrating a semiconductor device 200 in accordance with another embodiment of the present invention. FIG. 6 is a schematic cross-sectional view taken along a line C-C' shown in FIG. 5 in accordance with an embodiment of the present invention. FIG. 7 is a schematic perspective view illustrating a word line and a horizontal conductive line in accordance with an embodiment of the present invention. FIG. 8 is a schematic cross-sectional view taken along a line D-D' and a line E-E' shown in FIG. 7 in accordance with an embodiment of the present invention.

Referring to FIGS. 5 and 6, the semiconductor device 200 may include a memory cell array MCA, a peripheral circuit portion PERI, and a reservoir capacitor array RCA. The memory cell array MCA and the reservoir capacitor array RCA may be disposed at a higher level than the peripheral circuit portion PERI. The reservoir capacitor array RCA may be disposed adjacent to the memory cell array MCA. The reservoir capacitor array RCA of FIG. 5 may correspond to the reservoir capacitor array RCA shown in FIGS. 1 and 2. The peripheral circuit portion PERI may include a plurality of control circuits for controlling the memory cell array MCA and the reservoir capacitor array RCA.

Referring to FIG. 6, the memory cell array MCA may include a plurality of memory cells MC three-dimensionally arranged. Each of the memory cells MC may be disposed between a word line WL and a bit line BL, which are disposed to cross each other, and each of the memory cells MC may be coupled to the word lines WL and bit lines BL. Each memory cell MC may include a switching element TR and a data storage element CAP. The switching element TR and the data storage element CAP may be coupled to each other. The data storage element CAP may be coupled to the bit line BL through the switching element TR. The switching element TR may include a transistor (e.g., Field Effect Transistor, FET), and the data storage element CAP may include a capacitor. Hereinafter, the switching element TR is simply referred to as a transistor, and the data storage element CAP is simply referred to as a cell capacitor.

The transistor TR of each memory cell MC may include a cell horizontal layer HL. The cell horizontal layer HL may be coupled at one end thereof to the cell capacitor CAP and at an opposite end thereof to the bit line BL. The cell horizontal layer HL may include a first source/drain region, a second source/drain region, and a channel horizontally disposed between the first source/drain region and the second source/drain region. The transistor TR may further include a word line WL overlapping with the channel. A first side of the cell horizontal layer HL may be coupled to the bit line BL, and a second side of the cell horizontal layer HL may be coupled to the cell capacitor CAP. The cell horizontal layer HL may be referred to as an active layer or a thin-body layer.

Each memory cell MC may include a single transistor TR and a single cell capacitor CAP, which is referred to as a '1T1C cell'. The single cell capacitor CAP of the 1T1C cell may serve to store data, and the single transistor TR may serve as an access device for accessing the single cell capacitor CAP to read data from the single cell capacitor CAP or write data to the single cell capacitor CAP. According to another embodiment of the present invention, the single transistor TR may serve as a selective device.

The memory cell array MCA may include a plurality of bit lines BL, a plurality of transistors TR, and a plurality of cell capacitors CAP. The cell capacitors CAP may be vertically stacked in the first direction D1. The cell capacitors CAP stacked in the first direction D1 may share a cell common plate CPL.

The reservoir capacitor array RCA may include a plurality of the reservoir capacitor structures RCP, and each reservoir capacitor structure RCP may include a vertical conductive line VCL, a horizontal conductive line HCL, and a reservoir capacitor RC. The reservoir capacitor structures RCP may be vertically stacked in the first direction D1. The reservoir capacitor structures RCP stacked in the first direction D1 may share a common plate RPL.

The cell capacitors CAP and the reservoir capacitors RC may have the same structure. Each of the cell capacitors CAP and reservoir capacitors RC may include a first electrode SN, a dielectric layer DE, and a second electrode PN. The first electrodes SN of the cell capacitors CAP and the first electrodes SN of the reservoir capacitors RC may be formed of the same material and may have the same shape. The second electrodes PN of the cell capacitors CAP and the second electrodes PN of the reservoir capacitors RC may be formed of the same material and have the same shape. The dielectric layers DE of the cell capacitors CAP and the dielectric layers DE of the reservoir capacitors RC may be formed of the same material and have the same shape. The first electrodes SN of the cell capacitors CAP and the first electrodes SN of the reservoir capacitors RC may have a cylindrical shape.

The second electrodes PN of the cell capacitors CAP may be coupled to each other to be coupled to the cell common plate CPL. The second electrodes PN of the reservoir capacitor structures RCP may be coupled to each other to be coupled to the common plate RPL.

In the memory cell array MCA, a plurality of memory cells MC may be stacked in the first direction D1, and a plurality of memory cells MC may be horizontally arranged in the second and third directions D2 and D3. The memory cell array MCA may include a three-dimensional array of memory cells MC, and accordingly, the memory cell array MCA may include a three-dimensional array of cell capacitors CAP.

In the reservoir capacitor array RCA, a plurality of reservoir capacitor structures RCP may be stacked in the first direction D1, and also a plurality of reservoir capacitor structures RCP may be horizontally disposed in the second and third directions D2 and D3. As described above, the reservoir capacitor array RCA may include a three-dimensional array of the reservoir capacitor structures RCP.

Except for the transistor TR, the word line WL, and the horizontal conductive line HCL, the memory cell array MCA and the reservoir capacitor array RCA may have similar constituent elements. The bit line BL of the memory cell array MCA may correspond to the vertical conductive line VCL of the reservoir capacitor array RCA. The cell capacitors CAP of the memory cell array MCA may correspond to the reservoir capacitors RC of the reservoir capacitor array RCA.

The reservoir capacitors RC may have substantially the same structure as the cell capacitors CAP. The reservoir capacitors RC may be formed at the same level and have the same size as the cell capacitors CAP. The reservoir capacitors RC and the cell capacitors CAP may have substantially the same capacitance.

The memory cell array MCA may be a first column array including cell capacitors CAP that are stacked in the first direction D1. The cell capacitors CAP of the first column array may be referred to as a cell capacitor array. The reservoir capacitor array RCA may be a second column array including reservoir capacitors RC that are stacked in the first direction D1. In the first and second column arrays, each of the cell capacitors CAP and the reservoir capacitors RC may include a separate first electrode SN. Each of the cell capacitors CAP and reservoir capacitors RC may include a shared second electrode PN.

Each transistor TR may include a cell horizontal layer HL and a word line WL. The word line WL may include first and second word lines G1 and G2 that are facing each other with the cell horizontal layer HL interposed therebetween. A gate dielectric layer GD may be disposed between the cell horizontal layer HL and the word line WL. The gate dielectric layer GD may be formed between the first word line G1 and the cell horizontal layer HL and also between the second word line G2 and the cell horizontal layer HL.

The bit line BL of the memory cell array MCA may have a pillar shape extending in the first direction D1. The cell horizontal layer HL may have a bar shape extending in the second direction D2 intersecting the first direction D1. The word line WL may have a line shape extending in a third direction D3 intersecting the first and second directions D1 and D2.

The bit line BL may be vertically oriented in the first direction D1. The bit line BL may be referred to as a vertically oriented bit line or a pillar-shaped bit line. The bit line BL may include a conductive material. The bit line BL may include a silicon-based material, a metal-based material, or a combination thereof. The bit line BL may include silicon, a metal, a metal nitride, a metal silicide, or a combination thereof. The bit line BL may include polysilicon, titanium nitride, tungsten, or a combination thereof. For example, the bit line BL may include polysilicon or titanium nitride (TiN) which is doped with an N-type impurity. The bit line BL may include a TiN/W stack which includes titanium nitride and tungsten on titanium nitride.

The word line WL may extend in the third direction D3, and the cell horizontal layer HL may extend in the second direction D2. The cell horizontal layer HL may be horizontally arranged in the second direction D2 from the bit line BL. The word line WL may include a pair of word lines, that is, a first word line G1 and a second word line G2 facing each other in the first direction D1 with the cell horizontal layer HL interposed therebetween. A gate dielectric layer GD may be formed on upper and lower surfaces of the cell horizontal layer HL.

The same voltage may be applied to the first word line G1 and the second word line G2. For example, the first word line G1 and the second word line G2 may form a pair, and the same word line driving voltage may be applied to the first word line G1 and the second word line G2. As described above, the semiconductor device 200 according to the present embodiment may have a double word line structure in which two first and second word lines G1 and G2 are disposed adjacent to one cell horizontal layer HL. The double word line structure may also be referred to as a double gate structure.

The cell horizontal layer HL may include a semiconductor material. The cell horizontal layer HL may include a silicon-containing layer or a silicon-germanium-containing layer. For example, the cell horizontal layer HL may include silicon, monocrystalline silicon, doped polysilicon, undoped polysilicon, amorphous silicon, silicon germanium, or a combination thereof. According to another embodiment of the present invention, the cell horizontal layer HL may include a nano-wire or nano-sheet formed of a semiconductor material. According to another embodiment of the present invention, the cell horizontal layer HL may include an oxide semiconductor material. The cell horizontal layer HL may include a first source/drain region, a second source/drain region, and a channel between the first source/drain region and the second source/drain region.

The cell horizontal layer HL may have a thickness which is smaller than each of the thicknesses of the first and second word lines G1 and G2. The vertical thickness of the cell horizontal layer HL in the first direction D1 may be smaller than the vertical thickness of each of the first and second word lines G1 and G2 in the first direction D1. As described above, the cell horizontal layer HL may be referred to as a thin-body horizontal active layer.

The gate dielectric layer GD may be formed of silicon oxide, silicon nitride, a metal oxide, a metal oxynitride, a metal silicate, a high-k material, ferroelectric material, an anti-ferroelectric material, or a combination thereof. The gate dielectric layer GD may include $SiO_2$, $Si_3N_4$, $HfO_2$, $Al_2O_3$, $ZrO_2$, AlON, HfON, HfSiO, HfSiON, or HfZrO.

The first and second word lines G1 and G2 of the word line WL may include a metal, a metal mixture, a metal alloy, or a semiconductor material. The first and second word lines G1 and G2 of the word line WL may include titanium nitride, tungsten, polysilicon, or a combination thereof. For example, the first and second word lines G1 and G2 of the word line WL may include a TiN/W stack in which titanium nitride and tungsten are sequentially stacked. The first and second word lines G1 and G2 of the word line WL may include a high work function material, a low work function material, or a combination thereof. The low work function material may have a low work function of approximately 4.5 eV or less, and the high work function material may have a high work function of approximately 4.5 eV or more. For example, the low work function material may include N-type doped polysilicon, and the high work function material may include tungsten, titanium nitride, or a combination thereof. According to another embodiment of the present invention, the first and second word lines G1 and G2 of the word line WL may have a dual work function structure in which a low work function material and a high work function material are combined.

The cell capacitor CAP may be disposed horizontally from the transistor TR in the second direction D2. The first electrode SN of the cell capacitor CAP may have a horizontally oriented cylinder shape. The dielectric layer DE of the cell capacitor CAP may conformally cover the inner wall and the outer wall of the cylinder of the first electrode SN. The second electrode PN of the cell capacitor CAP may have a shape extending to the cylindrical inner wall and cylindrical outer wall of the first electrode SN over the dielectric layer DE of the cell capacitor CAP. The first electrode SN of the cell capacitor CAP may be electrically connected to the cell horizontal layer HL. According to another embodiment of the present invention, the first electrode SN of the cell capacitor CAP may have a pillar shape or a pylinder shape. The pylinder shape may refer to a structure in which a pillar shape and a cylinder shape are merged.

The first electrodes SN of the cell capacitors CAP and the first electrodes SN of the reservoir capacitors RC may be formed of the same material. The second electrodes PN of the cell capacitors CAP and the second electrodes PN of the reservoir capacitors RC may be formed of the same material. The first electrodes SN and the second electrodes PN may include a metal, a noble metal, a metal nitride, a conductive metal oxide, a conductive noble metal oxide, a metal carbide, a metal silicide, or a combination thereof. For example, the first electrodes SN and the second electrodes PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack.

The dielectric layers DE of the cell capacitors CAP and the dielectric layers DE of the reservoir capacitors RC may be formed of the same material. The dielectric layers DE may include silicon oxide, silicon nitride, a high-k material, or a combination thereof. The high-k material may have a higher dielectric constant than silicon oxide. Silicon oxide ($SiO_2$) may have a dielectric constant of approximately 3.9, and the first dielectric layer DE may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$).

According to another embodiment of the present invention, the dielectric layers DE may be formed of a composite layer including two or more layers of the aforementioned high-k materials.

The dielectric layers DE may be formed of zirconium (Zr)-based oxide. The dielectric layers DE may have a stacked structure including at least zirconium oxide ($ZrO_2$). The dielectric layers DE may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer ($ZrO_2$). According to another embodiment of the present invention, the dielectric layers DE may be formed of hafnium (Hf)-based oxide. The dielectric layers DE may have a stack structure including at least hafnium oxide ($HfO_2$). The dielectric layers DE may include a HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a greater bandgap energy (which will be, hereinafter, simply referred to as bandgap) than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material having a greater bandgap than the high-k material. The dielectric layer DE may include silicon oxide ($SiO_2$) as a high bandgap material other than aluminum oxide ($Al_2O_3$). Since the dielectric layer DE includes a high bandgap material, leakage current may be suppressed. The high-bandgap material may be thinner than the high-k material. According to another embodiment of the present invention, the dielectric layer DE may include a laminated structure in which a high-k material and a high-bandgap material are alternately stacked. For example, the dielectric layer DE may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the above laminated structure, the aluminum oxide ($Al_2O_3$) may be thinner than the zirconium oxide ($ZrO_2$) and hafnium oxide ($HfO_2$).

According to another embodiment of the present invention, the dielectric layer DE may include a stack structure, a laminated structure, or a mixed structure including zirconium oxide, hafnium oxide, and aluminum oxide.

According to another embodiment of the present invention, the dielectric layer DE may include a ferroelectric material or an antiferroelectric material. The ferroelectric material may include HfZrO, HfSiO, or a combination thereof.

According to another embodiment of the present invention, an interface control layer for improving leakage current may be further formed between the first electrode SN and the dielectric layer DE. The interface control layer may include titanium oxide ($TiO_2$), niobium oxide, or niobium nitride. The interface control layer may also be formed between the second electrode PN and the dielectric layer DE.

The cell capacitors CAP and the reservoir capacitors RC may include a Metal-Insulator-Metal (MIM) capacitor.

The upper-level horizontal layer CL2 and the lower-level horizontal layer CL3 of the horizontal conductive lines HCL of the reservoir capacitor array RCA may correspond to the first and second word lines G1 and G2 of the word lines WL of the memory cell array MCA. The upper-level horizontal layer CL2 may correspond to the first word line G1, and the lower-level horizontal layer CL3 may correspond to the second word line G2. The upper-level horizontal layer CL2 and the first word line G1 may be formed of the same material, and the lower-level horizontal layer CL3 and the second word line G2 may be formed of the same material. The upper-level horizontal layer CL2 and the first word line G1 may extend in the third direction D3, and the lower-level horizontal layer CL3 and the second word line G2 may extend in the third direction D3.

The bridge horizontal layers CL1 of the horizontal conductive lines HCL of the reservoir capacitor array RCA may correspond to the cell horizontal layers HL of the memory cell array MCA. The bridge horizontal layers CL1 and the cell horizontal layers HL may include different materials. The bridge horizontal layers CL1 may include a metal-based material, and the cell horizontal layers HL may include a semiconductor material or an oxide semiconductor material. Whereas the bridge horizontal layers CL1 may directly electrically contact the upper-level horizontal layers CL2 and the lower-level horizontal layers CL3, the cell horizontal layers HL may not be directly coupled to the first and second word lines G1 and G2. Gate dielectric layers GD may be disposed between the cell horizontal layers HL and the first and second word lines G1 and G2.

As will be described later, the bridge horizontal layers CL1 may be formed by replacing semiconductor materials with metal-based materials.

The semiconductor device 200 of FIGS. 5 and 6 may be a DRAM or a ferroelectric memory (FeRAM).

According to another embodiment of the present invention, the cell capacitor CAP and the reservoir capacitor RC may be replaced with another data storage material. For example, the data storage material may be a phase change material, a magnetic tunnel junction (MTJ), or a variable resistance material.

According to another embodiment of the present invention, the word line WL may be replaced with a single word line structure which is formed of the first word line G1 alone or the second word line G2 alone.

The peripheral circuit portion PERI may include peripheral circuits. The peripheral circuits may include a plurality of peripheral circuit transistors. The peripheral circuits may be disposed at a lower level than the memory cell array MCA and the reservoir capacitor array RCA which is a configuration referred to as a COP (Cell-Over-PERI) structure. The peripheral circuits may include at least one control circuit for driving the memory cell array MCA and the reservoir capacitor array RCA. The at least one control circuit of the peripheral circuits may include an N-channel transistor, a P-channel transistor, a CMOS circuit, or a combination thereof. The at least one control circuit of the peripheral circuit portion PERI may include an address decoder circuit, a read circuit, a write circuit, and the like. The at least one control circuit of the peripheral circuits may include a planar channel transistor, a recess channel transistor, a buried gate transistor, a fin channel transistor (Fin-FET), and the like.

For example, the peripheral circuits may include sub-word line drivers, a sense amplifier, and a reservoir capacitor control circuit. The word lines WL may be coupled to sub-word line drivers. The bit lines BL may be coupled to the sense amplifier. The reservoir capacitors RC may be coupled to the reservoir capacitor control circuit. The peripheral circuits may further include a control circuit that is coupled to a common cell plate CPL of the cell capacitors CAP.

According to another embodiment of the present invention, the peripheral circuit portion PERI may be disposed at a higher level than the memory cell array MCA and the reservoir capacitor array RCA which is a configuration referred to as a PUC (PERI-Over-Cell) structure. In the PUC structure, the peripheral circuits may be disposed at a higher level than the memory cell array MCA and reservoir capacitor array RCA.

According to another embodiment of the present invention, the peripheral circuit portion PERI may be referred to as a first peripheral circuit portion, and the reservoir capacitor array RCA may be referred to as a second peripheral circuit portion. Accordingly, the first peripheral circuit portion may be disposed at a lower level than the memory cell array MCA, and the second peripheral circuit portion may be disposed horizontally from the memory cell array MCA. The first peripheral circuit portion may include control circuits for controlling the memory cell array MCA, such as a sense amplifier and a sub-word line driver. The second peripheral circuit portion may include a reservoir capacitor array RCA, and the control circuits for controlling the reservoir capacitor array RCA may be disposed in the first peripheral circuit portion.

According to the above-described embodiment of the present invention, biases such as VPP may be stabilized by forming the reservoir capacitors RC.

Also, since a three-dimensional array of the reservoir capacitor array RCA is formed horizontally from the memory cell array MCA in the same structure as the cell capacitors CAP of the memory cell array MCA, the capacitance of the reservoir capacitors RC may be increased by securing the area for the reservoir capacitors RC.

FIGS. 9 to 22 are cross-sectional views illustrating a method of fabricating a semiconductor device in accordance with an embodiment of the present invention.

Figure 9:
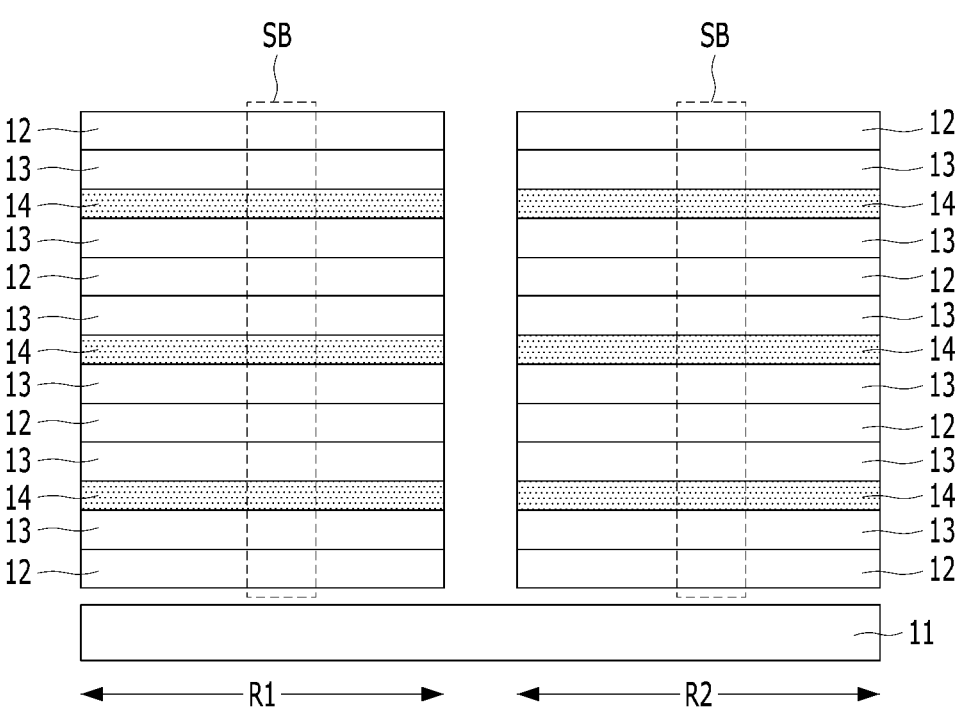
FIGS. 9 to 22 are cross-sectional views illustrating a method of fabricating a semiconductor device in accordance with an embodiment of the present invention.

Referring to FIG. 9, a stack body SB including a first region R1 and a second region R2 may be formed over a lower structure 11. The stack body SB may include a plurality of dielectric layers 12, a plurality of sacrificial layers 13, and a plurality of semiconductor layers 14. The stack body SB may be formed by repeatedly stacking a plurality of sub-stacks, each sub-stack including a four-layer structure in which a dielectric layer 12, a sacrificial layer 13, a semiconductor layer 14, and a sacrificial layer 13 are stacked in the mentioned order. The dielectric layers 12 may be silicon oxide, and the sacrificial layers 13 may be silicon nitride. The semiconductor layers 14 may include a silicon layer, a monocrystalline silicon layer, a polysilicon layer, or an oxide semiconductor. An uppermost layer of the stack body SB may be the dielectric layer 12.

According to another embodiment of the present invention, the sacrificial layer 13 disposed below the semiconductor layer 14 in the stack body SB may be referred to as a first sacrificial layer, and the sacrificial layer 13 disposed over the semiconductor layer 14 may be referred to as a second sacrificial layer. The dielectric layer 12 disposed below the first sacrificial layer may be referred to as a first dielectric layer, and the dielectric layer 12 disposed over the second sacrificial layer may be referred to as a second dielectric layer. Accordingly, each of the sub-stacks may include a first dielectric layer, a first sacrificial layer, a semiconductor layer, a second sacrificial layer, and a second dielectric layer that are stacked in the mentioned order. When the semiconductor layer 14 is polysilicon and the first and second dielectric layers include silicon oxide and the first and second sacrificial layers include silicon nitride, each of the sub-stacks may include an ONPNO (Oxide-Nitride-Polysilicon-Nitride-Oxide) stack.

The lower structure 11 may include a semiconductor substrate 11 or peripheral circuits.

Figure 10:
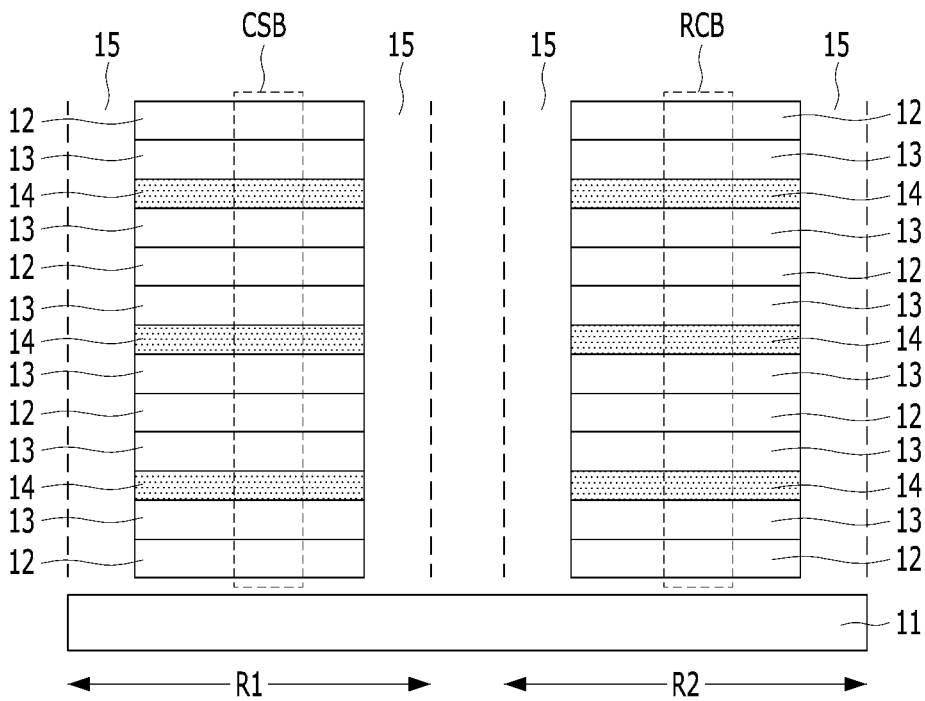

Referring to FIG. 10, a plurality of first openings 15 may be formed in the stack body SB. The first openings 15 may have a hole shape. To form the first openings 15, the stack body SB may be etched. The first openings 15 may be simultaneously formed in the first region R1 and the second region R2. The first openings 15 may have the same size or different sizes. As the first openings 15 are formed, a cell stack body CSB may be formed in the first region R1 and a reservoir stack body RCB may be formed in the second region R2. The stack body SB may be patterned into the cell stack body CSB including the first openings 15 and the reservoir stack body RCB.

Figure 11:
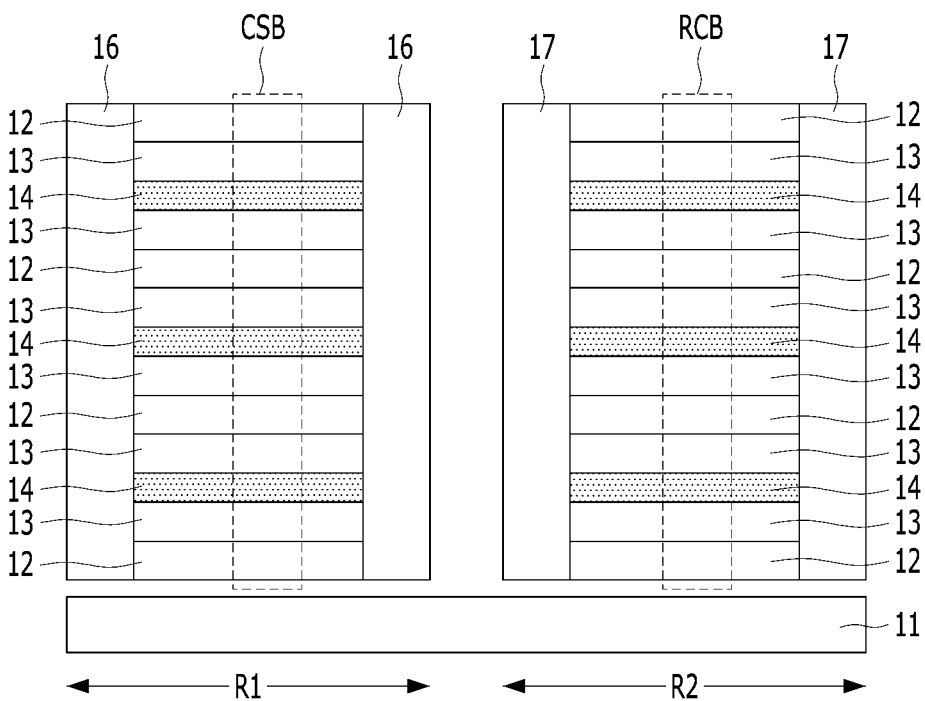

Referring to FIG. 11, first vertical sacrificial layers 16 and second vertical sacrificial layers 17 filling the first openings 15 may be formed. The first and second vertical sacrificial layers 16 and 17 may include a dielectric material. The first vertical sacrificial layers 16 may fill the first openings 15 of the first region R1, and the second vertical sacrificial layers 17 may fill the first openings 15 of the second region R2.

Figure 12:
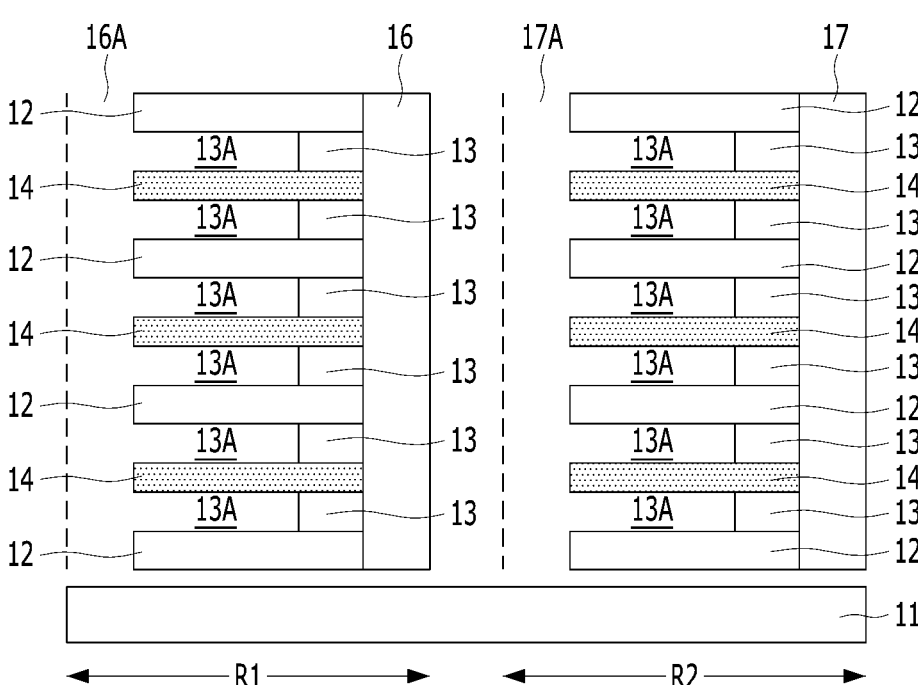

Referring to FIG. 12, a first sacrificial opening 16A may be formed in the first region R1, and a second sacrificial opening 17A may be formed in the second region R2. At least one first vertical sacrificial layer 16 may be removed from the first region R1 to form the first sacrificial opening 16A. At least one second vertical sacrificial layer 17 may be removed from the second region R2 to form the second sacrificial opening 17A.

Subsequently, a plurality of horizontal recesses 13A may be formed in the first region R1 and the second region R2. The horizontal recesses 13A may be simultaneously formed in the first region R1 and the second region R2. In order to form the horizontal recesses 13A, portions of the sacrificial layers 13 may be recessed horizontally. For example, portions of the sacrificial layers 13 may be etched.

Some surfaces of the semiconductor layers 14 may be exposed by the horizontal recesses 13A which are formed between the dielectric layers 12 and the semiconductor layers 14. A portion of each of the sacrificial layers 13 may remain between the dielectric layers 12 and the semiconductor layers 14. The remaining sacrificial layers 13 and the horizontal recesses 13A may be disposed at the same level.

Figure 13:
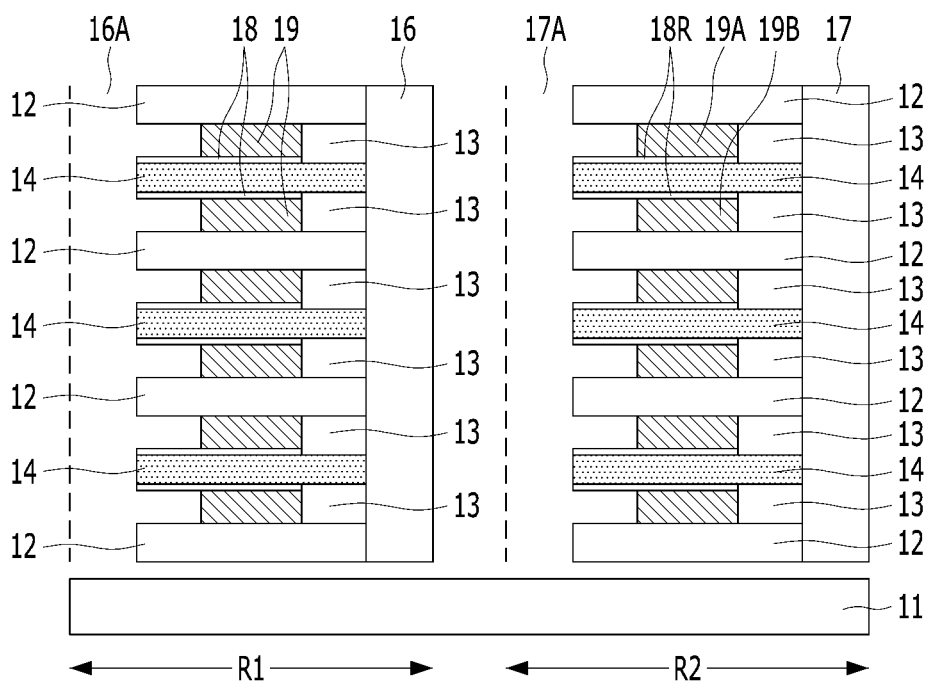

Referring to FIG. 13, gate dielectric layers 18 and sacrificial gate dielectric layers 18R may be formed. The gate dielectric layers 18 may be formed on exposed surfaces of the semiconductor layers 14 in the first region R1. The sacrificial gate dielectric layers 18R may be formed on the exposed surfaces of the semiconductor layers 14 in the second region R2. The gate dielectric layers 18 and the sacrificial gate dielectric layers 18R may be formed by an oxidation process. The gate dielectric layers 18 and the sacrificial gate dielectric layers 18R may include silicon oxide.

Subsequently, double-structured word lines 19 filling the horizontal recesses 13A may be formed over the gate dielectric layers 18 in the first region R1. An upper-level horizontal layer 19A and a lower-level horizontal layer 19B filling the horizontal recesses 13A may be formed over the sacrificial gate dielectric layers 18R in the second region R2. The word lines 19, the upper-level horizontal layer 19A, and the lower-level horizontal layer 19B may be formed of the same material. The word lines 19, the upper-level horizontal layer 19A, and the lower-level horizontal layer 19B may each include a conductive material. The upper-level horizontal layer 19A and the lower-level horizontal layer 19B may be referred to as a first conductive horizontal layer and a second conductive horizontal layer, respectively.

The word lines 19, the upper-level horizontal layer 19A, and the lower-level horizontal layer 19B may include a metal, a metal alloy, a semiconductor material, or a combination thereof. For example, each of the word lines 19, the upper-level horizontal layer 19A, and the lower-level horizontal layer 19B may include titanium nitride, tungsten, molybdenum, molybdenum nitride, polysilicon, or a combination thereof. The word lines 19, the upper-level horizontal layer 19A, and the lower-level horizontal layer 19B may be formed of the same material. According to an embodiment of the present invention, the word lines 19, the upper-level horizontal layer 19A, and the lower-level horizontal layer 19B may include a TiN/W stack in which titanium nitride and tungsten are sequentially stacked. According to another embodiment of the present invention, the word lines 19, the upper-level horizontal layer 19A, and the lower-level horizontal layer 19B may include a high work function material, a low work function material, or a combination thereof. The low work function material may have a low work function of approximately 4.5 eV or less, and the high work function material may have a high work function of approximately 4.5 eV or more. For example, the low work function material may include N-type doped polysilicon, and the high work function material may include tungsten, titanium nitride, or a combination thereof. According to another embodiment of the present invention, each of the word lines 19, the upper-level horizontal layer 19A, and the lower-level horizontal layer 19B may have a dual work function structure in which a low work function material and a high work function material are combined.

For example, to form the word lines 19, the upper-level horizontal layer 19A, and the lower-level horizontal layer 19B, a process of depositing a metal layer and an etching process may be performed. The upper-level horizontal layer 19A and the lower-level horizontal layer 19B may correspond to a pair of the upper-level horizontal layer CL2 and the lower-level horizontal layer CL3 in the above-described embodiments of the present invention.

Referring to FIGS. 9 to 14, portions of the sacrificial layers 13 of the stack body SB in the second region R2 may be replaced with the conductive horizontal layers, that is, the upper-level horizontal layer 19A and the lower-level horizontal layer 19B.

Figure 14:
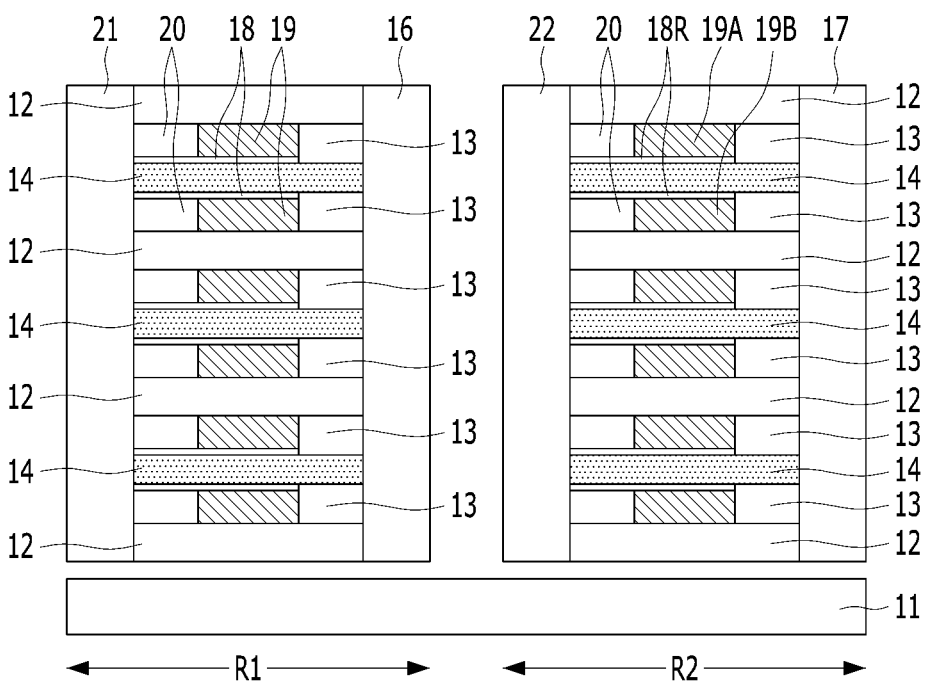

Referring to FIG. 14, capping layers 20 may be formed over the gate dielectric layers 18 and the sacrificial gate dielectric layers 18R that are exposed by the word lines 19, the upper-level horizontal layer 19A, and the lower-level horizontal layer 19B. The capping layers 20 may include a dielectric material. The capping layers 20 may be disposed at the same level as the word lines 19, the upper-level horizontal layer 19A, and the lower-level horizontal layer 19B. The capping layers 20 may be referred to as bit line-side capping layers.

Subsequently, vertical insulators 21 and 22 filling the first sacrificial opening 16A and the second sacrificial opening 17A, respectively, may be formed.

Figure 15:
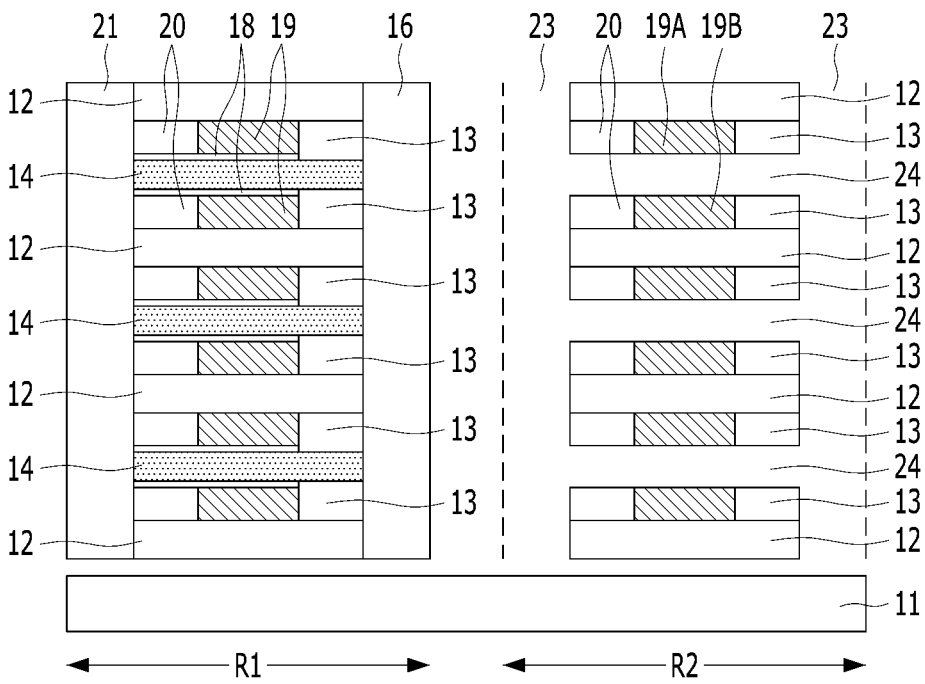

Referring to FIG. 15, the vertical insulator 22 and the second vertical sacrificial layer 17 may be selectively removed from the second region R2. As a result, a plurality of second openings 23 may be formed in the second region R2.

Subsequently, the semiconductor layers 14 of the second region R2 may be selectively removed through the second openings 23. As the semiconductor layers 14 are removed, a bridge gap 24 may be formed between the upper-level horizontal layer 19A and the lower-level horizontal layer 19B. The bridge gaps 24 may be disposed in the space where the semiconductor layers 14 between the upper-level horizontal layer 19A and the lower-level horizontal layer 19B are removed. For example, the upper-level horizontal layer 19A and the lower-level horizontal layer 19B may face each other with one bridge gap 24 interposed therebetween.

Figure 16:
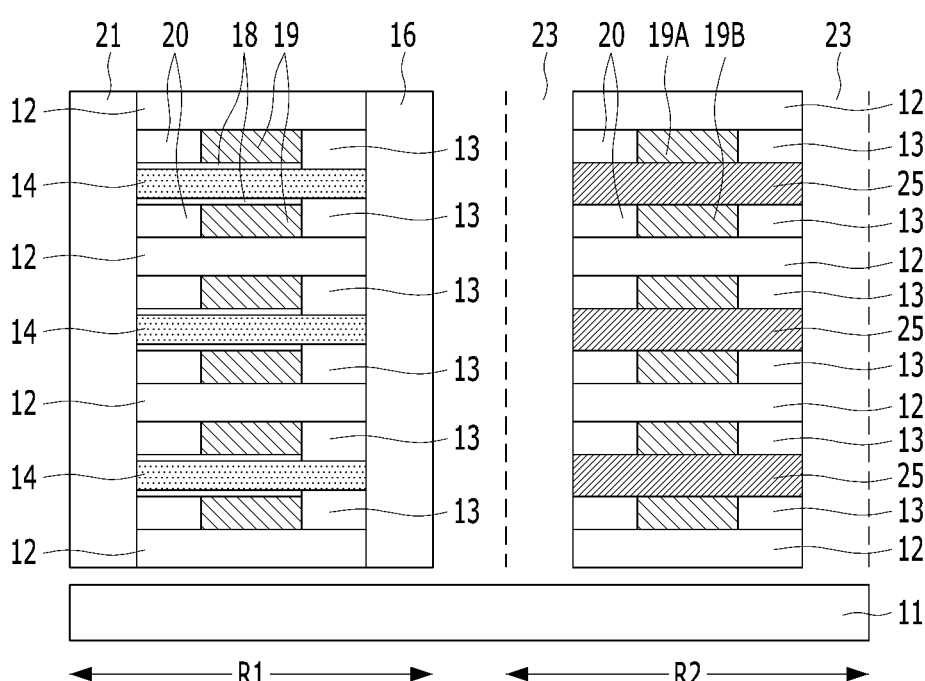

Referring to FIG. 16, bridge gap-fill layers 25 filling the bridge gaps 24 may be formed. The bridge gap-fill layers 25 may include a conductive material. The bridge gap-fill layer 25 may include a metal, a metal alloy, a semiconductor material, or a combination thereof. For example, the bridge gap-fill layer 25 may include titanium nitride, tungsten, molybdenum, molybdenum nitride, polysilicon, or a combination thereof. According to another embodiment of the present invention, the bridge gap-fill layer 25 may include a TiN/W stack in which titanium nitride and tungsten are sequentially stacked.

The bridge gap-fill layers 25 may include a metal-based material. The bridge gap-fill layers 25 may be electrically connected to the upper-level horizontal layer 19A and the lower-level horizontal layer 19B.

The bridge gap-fill layers 25, the upper-level horizontal layer 19A, and the lower-level horizontal layer 19B may be of the same material.

The semiconductor layers 14 may remain in the first region R1. The semiconductor layers 14 and the bridge gap-fill layers 25 may be disposed at the same level.

As a result of a series of the processes described above, the semiconductor layers 14 may be formed in the first region R1 and the bridge gap-fill layers 25 may be formed in the second region R2. The semiconductor layers 14 may include a semiconductor material, and the bridge gap-fill layers 25 may include a metal-based material.

Figure 17:
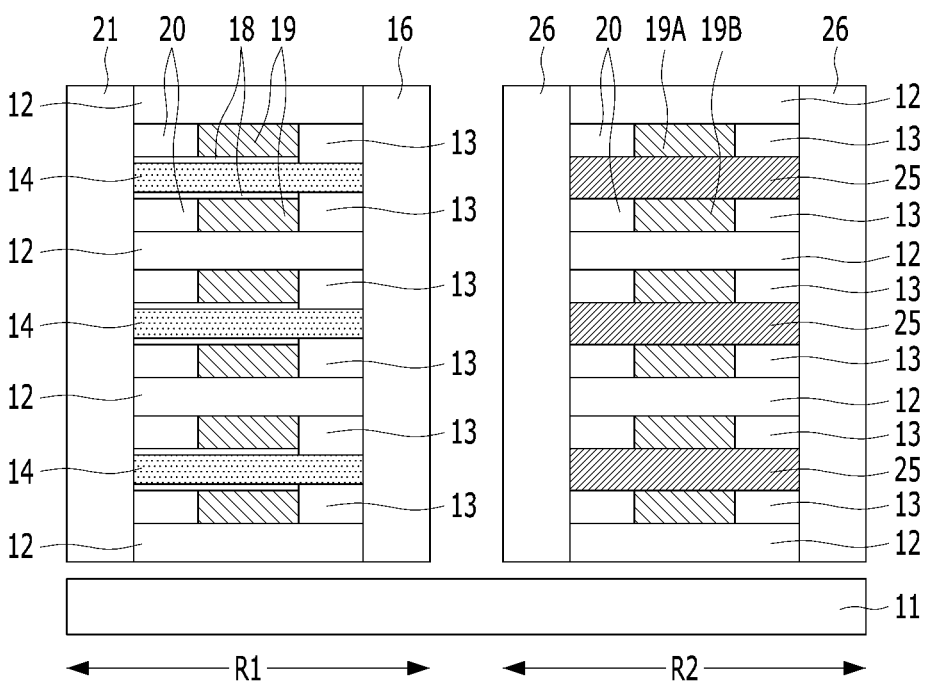

Referring to FIG. 17, insulators 26 filling the second openings 23 may be formed.

Figure 18:
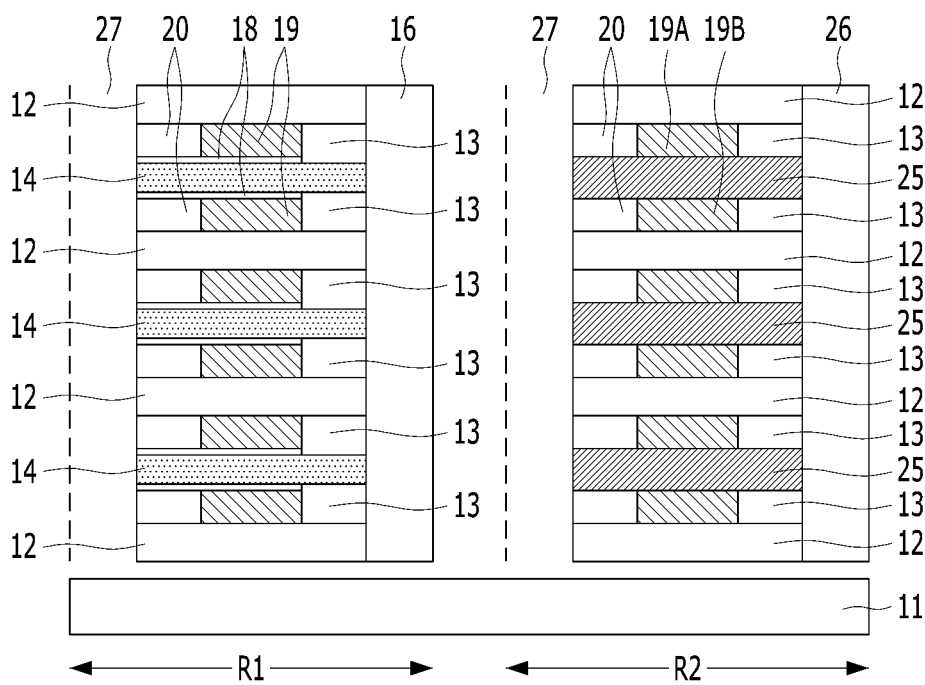

Referring to FIG. 18, first vertical openings 27 may be formed in the first region R1 and the second region R2, individually. The first vertical openings 27 of the first region R1 may expose first-side edges of the semiconductor layers 14. The first vertical openings 27 of the second region R2 may expose first-side edges of the bridge gap-fill layers 25.

Figure 19:
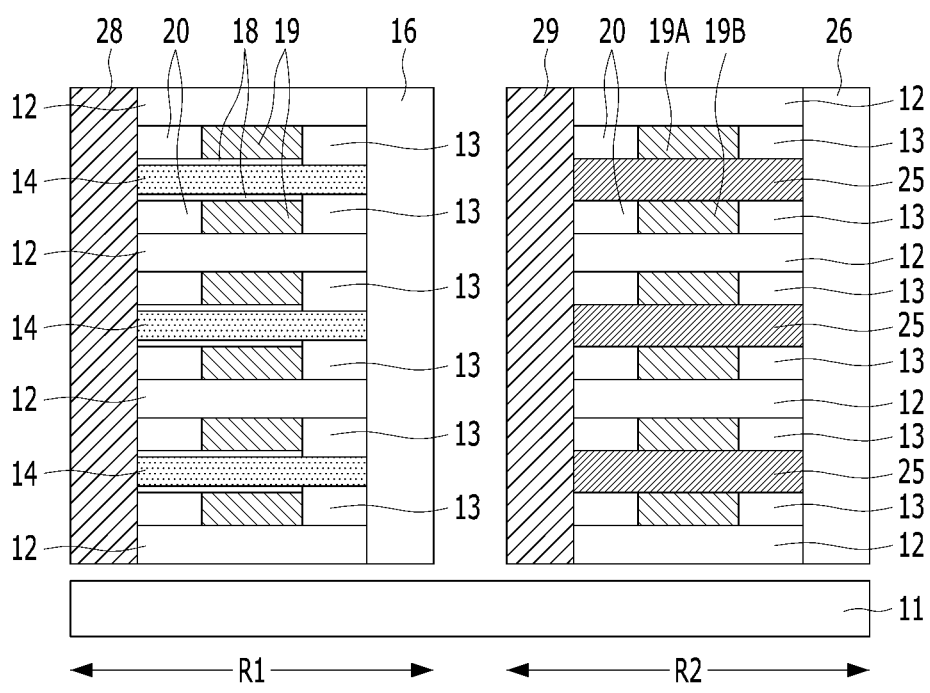

Referring to FIG. 19, a bit line 28 may be formed in the first region R1, and a vertical conductive line 29 may be formed in the second region R2. The bit line 28 may fill the first vertical opening 27 of the first region R1, and the vertical conductive line 29 may fill the second vertical opening 27 of the second region R2. The bit line 28 and the vertical conductive line 29 may be oriented in a direction perpendicular to the surface of the lower structure 11. The bit line 28 may be commonly coupled to the first-side edges of the semiconductor layers 14, and the vertical conductive line 29 may be commonly coupled to the first-side edges of the bridge gap-fill layers 25.

The bit line 28 and the vertical conductive line 29 may include the same material or different materials. The bit line 28 and the vertical conductive line 29 may include a silicon-based material, a metal-based material, or a combination thereof. The bit line 28 and vertical conductive line 29 may include silicon, a metal, a metal nitride, a metal silicide, or a combination thereof. The bit line 28 and vertical conductive line 29 may include polysilicon, titanium nitride, tungsten, or a combination thereof. For example, the bit line 28 and the vertical conductive line 29 may include polysilicon or titanium nitride (TiN) that is doped with an N-type impurity. The bit line 28 and the vertical conductive line 29 may include a TiN/W stack including titanium nitride and tungsten over the titanium nitride.

Figure 20:
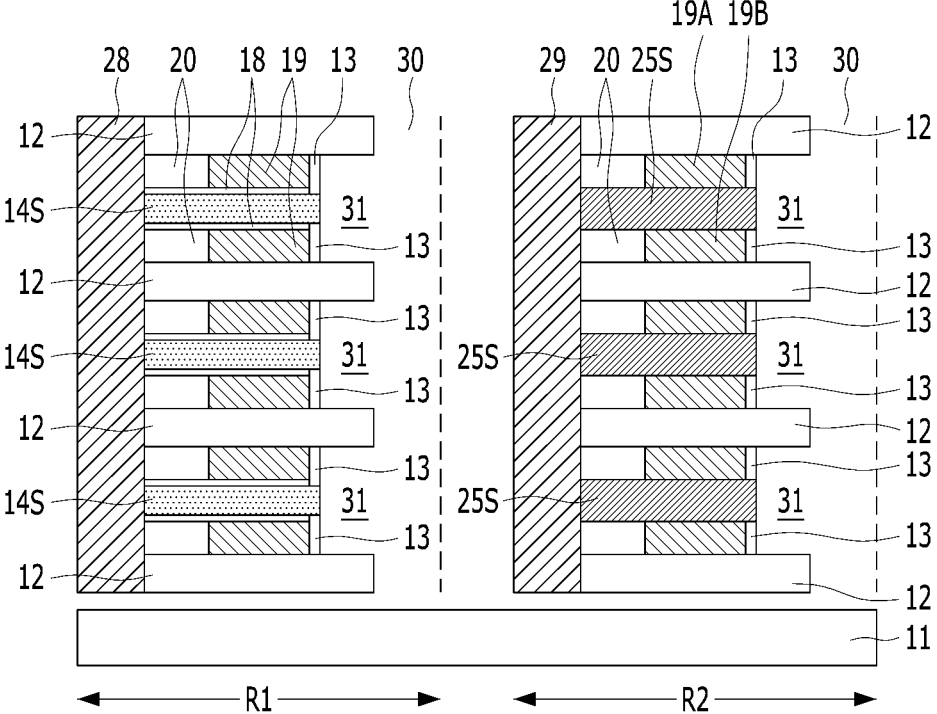

Referring to FIG. 20, second vertical openings 30 and capacitor openings 31 may be formed in the first region R1 and the second region R2, respectively. First, second vertical openings 30 may be formed by removing the insulators 16 and 26, and capacitor openings 31 may be formed by horizontally recessing the sacrificial layers 13, the semiconductor layers 14, and the bridge gap-fill layers 25 from the second vertical openings 30. Cell horizontal layers 14S may be formed in the first region R1 by the recessing of the semiconductor layers 14, and bridge horizontal layers 25S may be formed in the second region R2 by the recessing of the bridge gap-fill layers 25. The capacitor openings 31 of the first region R1 may expose second-side edges of the cell horizontal layers 14S. The capacitor openings 31 of the second region R2 may expose second-side edges of the bridge horizontal layers 25S. First-side edges of the cell horizontal layers 14S may be coupled to the bit line 28, and first-side edges of the bridge horizontal layers 25S may be coupled to the vertical conductive line 29. Portions of the sacrificial layers 13 may remain on the second-side edges of the word lines 19 and the gate dielectric layers 18, and portions of the sacrificial layers 13 may remain on the second-side edges of the upper level horizontal layer 19A and the lower level horizontal layer 19B. The remaining sacrificial layers 13 may be referred to as a capacitor-side capping layer.

Referring to FIGS. 15 to 20, the semiconductor layers 14 of the second region R2 may be replaced with the bridge horizontal layers 25S.

Figure 21:
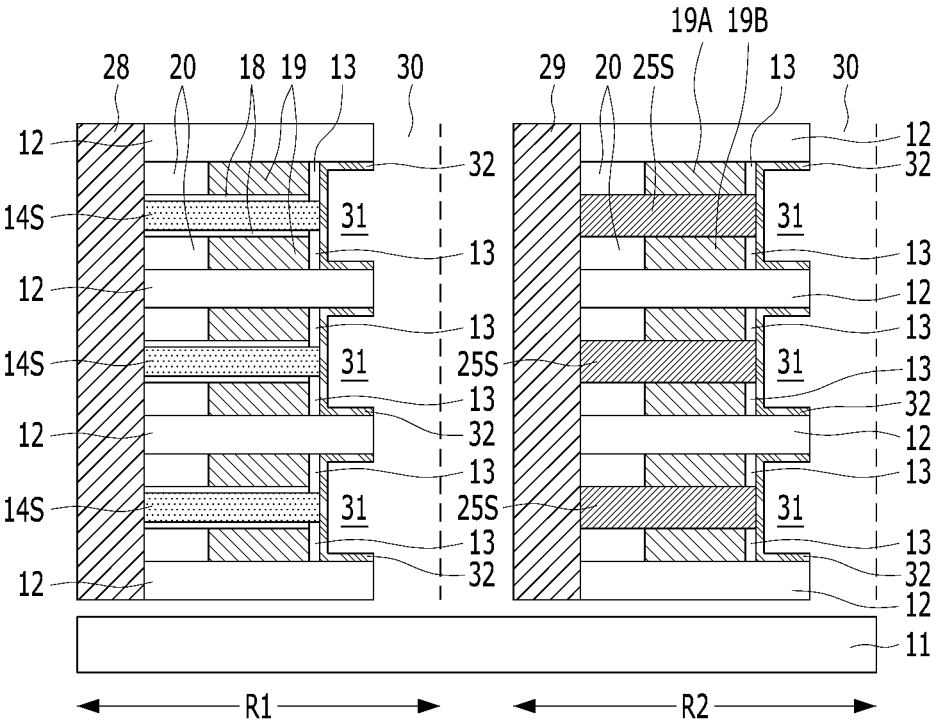

Referring to FIG. 21, first electrodes 32 of the cell capacitors may be formed in the capacitor openings 31 of the first region R1. The first electrodes 32 of the reservoir capacitor may be formed in the capacitor openings 31 of the second region R2.

Figure 22:
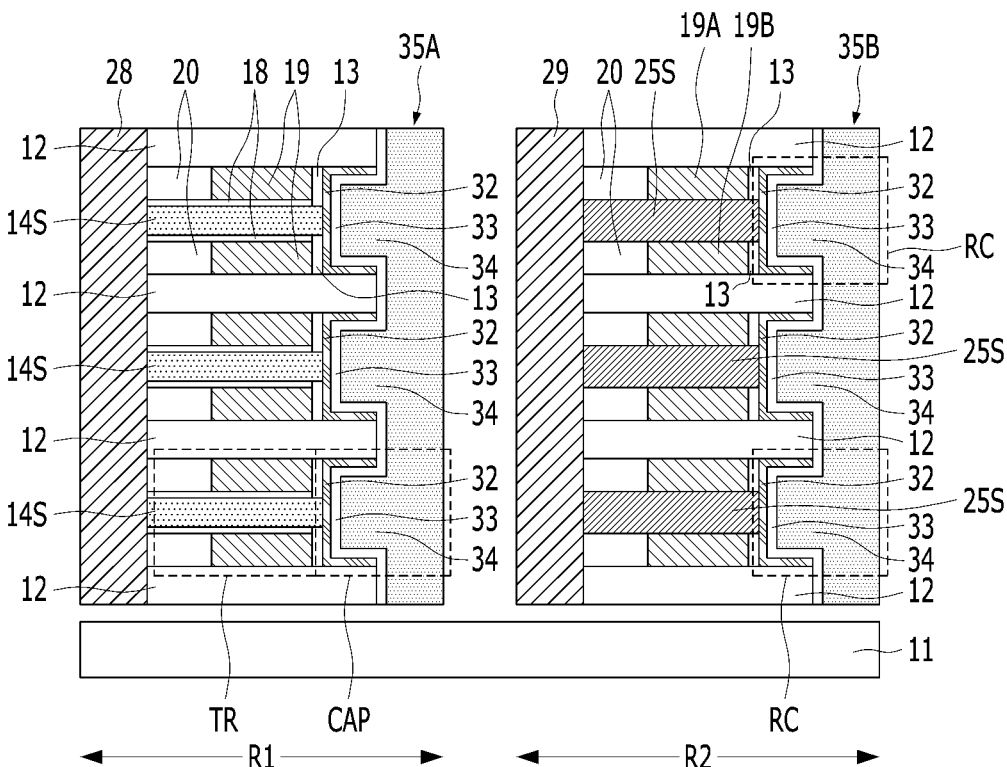

Referring to FIG. 22, a dielectric layer 33 and a second electrode 34 may be formed over the first electrodes 32 of the first region R1. The dielectric layer 33 and the second electrode 34 may be formed over the first electrodes 32 of the second region R2.

The first electrodes 32 of the cell capacitors CAP and the first electrodes 32 of the reservoir capacitors RC may be formed of the same material and may have the same shape. The second electrodes 34 of the cell capacitors CAP and the second electrodes 34 of the reservoir capacitors RC may be formed of the same material and may have the same shape. The dielectric layers 33 of the cell capacitors CAP and the dielectric layers 33 of the reservoir capacitors RC may be formed of the same material and may have the same shape. The first electrodes 32 of the cell capacitors CAP and the first electrodes 32 of the reservoir capacitors RC may have a cylindrical shape.

The first electrodes 32 and the second electrodes 34 may include titanium (Ti), titanium nitride (TiN), tantalum (Ta), tantalum nitride (TaN), tungsten (W), tungsten nitride (WN), ruthenium (Ru), ruthenium oxide (RuO$_2$), iridium (Ir), iridium oxide (IrO$_2$), platinum (Pt), molybdenum (Mo), molybdenum oxide (MoO), a titanium nitride/tungsten (TiN/W) stack or a tungsten nitride/tungsten (WN/W) stack.

The dielectric layers 33 may include hafnium oxide (HfO$_2$), zirconium oxide (ZrO$_2$), aluminum oxide (Al$_2$O$_3$), lanthanum oxide (La$_2$O$_3$), titanium oxide (TiO$_2$), tantalum oxide (Ta$_2$O$_5$), niobium oxide (Nb$_2$O$_5$) or strontium titanium oxide (SrTiO$_3$). The dielectric layers 33 may include a ZA (ZrO$_2$/Al$_2$O$_3$) stack, a ZAZ (ZrO$_2$/Al$_2$O$_3$/ZrO$_2$) stack, an HA (HfO$_2$/Al$_2$O$_3$) stack, or a HAH (HfO$_2$/Al$_2$O$_3$/HfO$_2$) stack. The dielectric layers 33 may include a ZAZA (ZrO$_2$/Al$_2$O$_3$/ZrO$_2$/Al$_2$O$_3$) stack, a ZAZAZ (ZrO$_2$/Al$_2$O$_3$/ZrO$_2$/Al$_2$O$_3$/ZrO$_2$) stack, a HAHA (HfO$_2$/Al$_2$O$_3$/HfO$_2$/Al$_2$O$_3$) stack, or a HAHAH (HfO$_2$/Al$_2$O$_3$/HfO$_2$/Al$_2$O$_3$/HfO$_2$) stack. The dielectric layers 33 may include a ferroelectric material or an antiferroelectric material. The ferroelectric material may include HfZrO, HfSiO, or a combination thereof.

As a result of a series of the processes described above, the cell capacitors CAP may be formed in the first region R1 and the reservoir capacitors RC may be formed in the second region R2. The reservoir capacitors RC may be coupled to the bridge horizontal layers 25S and the vertical conductive line 29. The bridge horizontal layer 25S, the upper-level horizontal layer 19A, and the lower-level horizontal layer 19B may be electrically connected. The second electrodes 34 of the cell capacitors CAP may be merged with each other to form a cell common plate 35A. The second electrodes 34 of the reservoir capacitors RC may be merged with each other to form a common plate 35B.

FIGS. 23 to 27 are cross-sectional views illustrating a method of fabricating a semiconductor device in accordance with another embodiment of the present invention.

Figure 23:
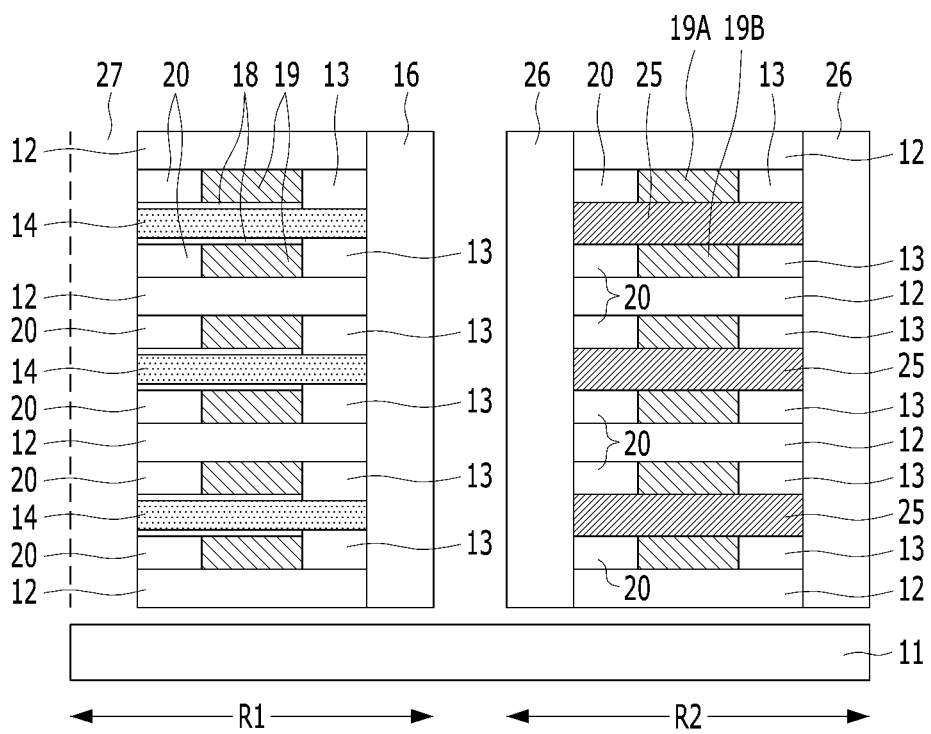
FIGS. 23 to 27 are cross-sectional views illustrating a method of fabricating a semiconductor device in accordance with another embodiment of the present invention.

Referring to FIG. 23, following FIG. 17, first vertical opening 27 may be formed in the first region R1. The first vertical opening 27 of the first region R1 may expose the first-side edges of the semiconductor layers 14.

Figure 24:
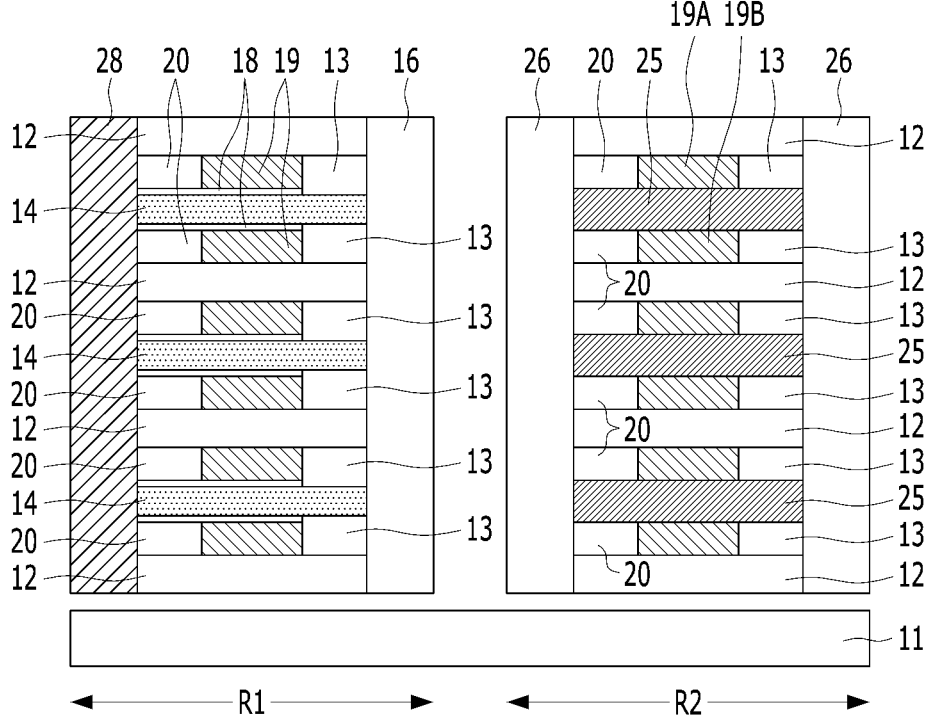

Referring to FIG. 24, a bit line 28 may be formed in the first region R1.

Figure 25:
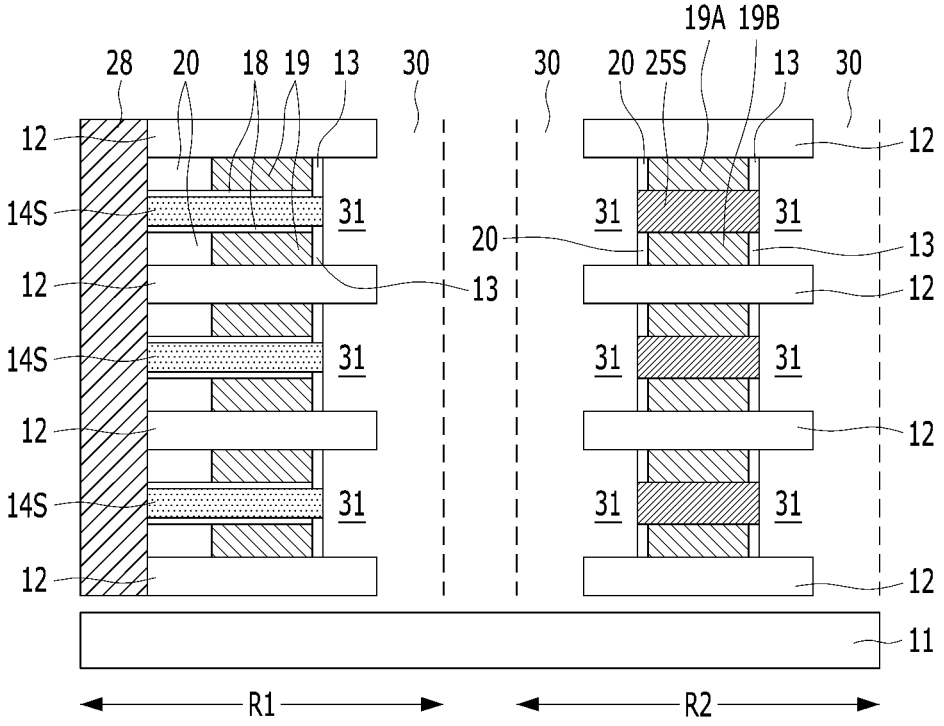

Referring to FIG. 25, second vertical openings 30 and capacitor openings 31 may be formed in the first region R1 and the second region R2, respectively. First, the second vertical openings 30 may be formed by removing the insulators 16 and 26, and the capacitor openings 31 may be formed by horizontally recessing the sacrificial layers 13, the semiconductor layers 14, and the bridge gap-fill layers 25 from the second vertical openings 30. The cell horizontal layers 14S may be formed in the first region R1 by the recessing of the semiconductor layers 14, and the bridge horizontal layers 25S may be formed in the second region R2 by the recessing of the bridge gap-fill layers 25. The capacitor openings 31 of the first region R1 may expose the second-side edges of the cell horizontal layers 14S. The capacitor openings 31 in the second region R2 may expose the edges on both sides of the bridge horizontal layers 25S. The first-side edges of the cell horizontal layers 14S may be coupled to the bit line 28, and the edges on both sides of the bridge horizontal layers 25S may be exposed by the capacitor openings 31.

Figure 26:
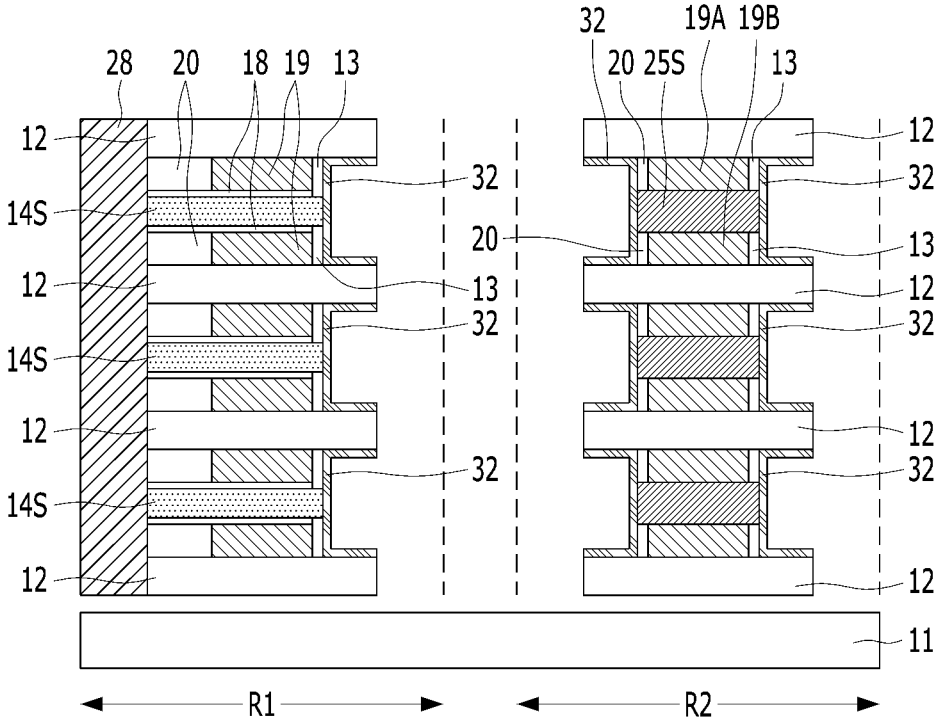

Referring to FIG. 26, first electrodes 32 of cell capacitors may be formed in the capacitor openings 31 of the first region R1. Also, first electrodes 32 of the reservoir capacitor may be formed in the capacitor openings 31 of the second region R2.

The first electrodes 32 of the reservoir capacitor may be respectively coupled to the edges on both sides of the bridge horizontal layers 25S. The first electrodes 32 of the capacitors may be coupled to the second-side edges of the cell horizontal layers 14S.

Figure 27:
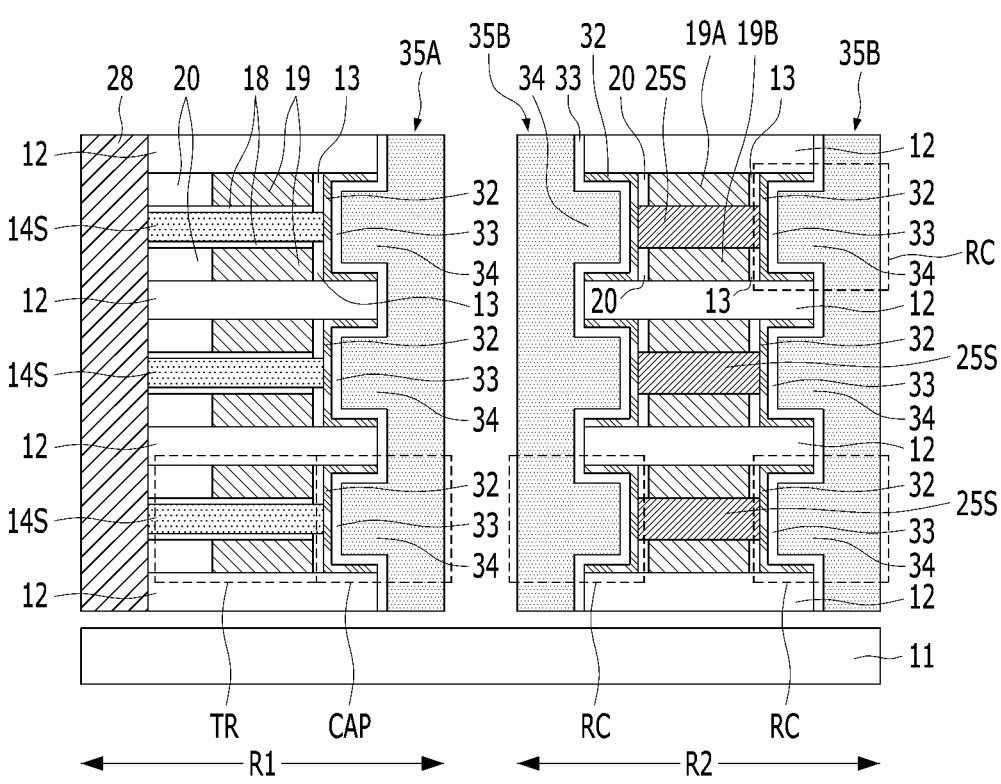

Referring to FIG. 27, a dielectric layer 33 and a second electrode 34 may be formed over the first electrodes 32 of the first region R1. The dielectric layer 33 and the second electrode 34 may be formed over the first electrodes 32 of the second region R2.

An array of single cell capacitors CAP may be formed in the first region R1, and an array of double reservoir capacitors RC may be formed in the second region R2. A vertical conductive line may be omitted in the second region R2, and two reservoir capacitors RC may be coupled to one bridge horizontal layer 25S.

As a result of a series of the processes described above, cell capacitors CAP may be formed in the first region R1, and reservoir capacitors RC may be formed in the second region R2. Two reservoir capacitors RC may be coupled to one bridge horizontal layer 25S. The bridge horizontal layers 25S, the upper-level horizontal layer 19A, and the lower-level horizontal layer 19B may be electrically connected. The second electrodes 34 of the cell capacitors CAP may be merged with each other to form a cell common plate 35A. The second electrodes 34 of the reservoir capacitors RC may be merged with each other to form a common plate 35B.

According to an embodiment of the present invention, since a reservoir capacitor array is formed to be disposed horizontally from a memory cell array, it is possible to stabilize a bias.

According to an embodiment of the present invention, since a three-dimensional array of the reservoir capacitors is formed horizontally from a memory cell array in the same structure as those of the cell capacitors of a three-dimensional memory cell array, it is possible to increase the capacitance of the reservoir capacitors by securing the area of the reservoir capacitors.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A semiconductor device, comprising:

a lower structure;

a vertical conductive line extending in a first direction which is perpendicular to a surface of the lower structure;

a reservoir capacitor disposed over the lower structure to be spaced apart from the vertical conductive line;

a bridge horizontal layer disposed between the vertical conductive line and the reservoir capacitor and extending horizontally in a second direction which is parallel to the surface of the lower structure; and a pair of horizontal layers extending in a third direction intersecting the bridge horizontal layer with the bridge horizontal layer interposed therebetween wherein the bridge horizontal layer and the horizontal layers are formed of a metal-based material, and wherein the bridge horizontal layer directly and electrically connects the horizontal layers.

2. The semiconductor device of claim 1, wherein the bridge horizontal layer includes a first edge contacting the vertical conductive line and a second edge contacting the reservoir capacitor.

3. The semiconductor device of claim 1, wherein the reservoir capacitor includes:

a cylindrical first electrode coupled to the bridge horizontal layer;

a dielectric layer over the cylindrical first electrode; and a second electrode over the dielectric layer.

4. The semiconductor device of claim 1, wherein the vertical conductive line includes a silicon-based material, a metal-based material, or a combination thereof.

5. The semiconductor device of claim 1, further comprising:

a low voltage node which is coupled to the vertical conductive line; and a high voltage node which is coupled to the reservoir capacitor.

6. A semiconductor device, comprising:

a memory cell array including a three-dimensional array of cell capacitors; and a reservoir capacitor array which is horizontally spaced apart from the memory cell array and includes a three-dimensional array of reservoir capacitor structures, wherein each of the reservoir capacitor structures includes:

a vertical conductive line;

a reservoir capacitor which is spaced apart from the vertical conductive line and has the same structure as structures of the cell capacitors;

a bridge horizontal layer oriented horizontally between the vertical conductive line and the reservoir capacitor; and a pair of horizontal layers extending in a direction intersecting the bridge horizontal layer with the bridge horizontal layer interposed therebetween wherein the bridge horizontal layer and the horizontal layers are formed of a metal-based material, and wherein the bridge horizontal layer directly and electrically connects the horizontal layers.

7. The semiconductor device of claim 6, wherein the bridge horizontal layer includes a first edge contacting the vertical conductive line, and a second edge contacting the reservoir capacitor.

8. The semiconductor device of claim 6, wherein each of the cell capacitors and the reservoir capacitors includes:

a cylindrical first electrode;

a dielectric layer over the cylindrical first electrode; and a second electrode over the dielectric layer.

9. The semiconductor device of claim 6, wherein the vertical conductive line includes a silicon-based material, a metal-based material, or a combination thereof.

10. The semiconductor device of claim 6, further comprising:

a low voltage node which is coupled to the vertical conductive line; and a high voltage node which is coupled to the reservoir capacitor.

11. The semiconductor device of claim 6, wherein the memory cell array includes:

a vertical bit line;

a cell horizontal layer which is oriented horizontally between the bit line and the cell capacitors;

a pair of word lines extending in a direction intersecting the cell horizontal layer with the cell horizontal layer interposed therebetween; and a gate dielectric layer between the word lines and the cell horizontal layer.

12. The semiconductor device of claim 11, wherein the cell horizontal layer includes monocrystalline silicon, polysilicon or an oxide semiconductor.

13. The semiconductor device of claim 6, further comprising:

a peripheral circuit portion disposed at a lower level than the memory cell array and the reservoir capacitor array.

14. The semiconductor device of claim 6, wherein the cell capacitors and the reservoir capacitors are disposed at the same horizontal level.

* * * * *